(12) United States Patent
Vielemeyer

(10) Patent No.: US 9,048,091 B2
(45) Date of Patent: Jun. 2, 2015

(54) METHOD AND SUBSTRATE FOR THICK III-N EPITAXY

(71) Applicant: Infineon Technologies Austria AG, Villach (AT)

(72) Inventor: Martin Vielemeyer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/849,864

(22) Filed: Mar. 25, 2013

(65) Prior Publication Data

US 2014/0284609 A1    Sep. 25, 2014

(51) Int. Cl.
| | |
|---|---|
| *H01L 21/02* | (2006.01) |
| *H01L 29/267* | (2006.01) |
| *H01L 29/04* | (2006.01) |
| *H01L 29/20* | (2006.01) |

(52) U.S. Cl.
CPC ...... *H01L 21/0243* (2013.01); *H01L 21/02381* (2013.01); *H01L 21/0254* (2013.01); *H01L 29/267* (2013.01); *H01L 29/045* (2013.01); *H01L 29/2003* (2013.01); *H01L 21/02433* (2013.01); *H01L 21/02658* (2013.01)

(58) Field of Classification Search
CPC ...... H01L 21/02104; H01L 21/2015; H01L 29/267; H01L 33/0062; H01L 33/0066; H01L 33/007; H01L 33/0075; H01L 33/0079

USPC ............... 257/E21.097, E21.112, E21.119; 438/455, 456

See application file for complete search history.

(56) References Cited

U.S. PATENT DOCUMENTS

| | | | |
|---|---|---|---|
| 6,255,198 B1 * | 7/2001 | Linthicum et al. | 438/481 |
| 8,716,106 B2 * | 5/2014 | Akiyama | 438/458 |
| 2004/0029365 A1 * | 2/2004 | Linthicum et al. | 438/481 |
| 2008/0006849 A1 * | 1/2008 | Liu et al. | 257/213 |
| 2008/0112448 A1 * | 5/2008 | Ueda et al. | 372/44.011 |
| 2008/0296584 A1 * | 12/2008 | Hachigo | 257/76 |
| 2013/0270608 A1 * | 10/2013 | Bayram et al. | 257/200 |

* cited by examiner

*Primary Examiner* — Thao X Le
*Assistant Examiner* — J.R. Oakley
(74) *Attorney, Agent, or Firm* — Murphy, Bilak & Homiller, PLLC

(57) ABSTRACT

A method of manufacturing an III-N substrate includes bonding a Si substrate to a support substrate, the Si substrate having a (111) growth surface facing away from the support substrate, thinning the Si substrate at the (111) growth surface to a thickness of 100 μm or less, and forming III-N material on the (111) growth surface of the Si substrate after the Si substrate is thinned. The support substrate has a coefficient of thermal expansion more closely matched to that of the III-N material than the Si substrate. Other methods of manufacturing an III-N substrate are disclosed, as well as the corresponding wafer structures.

15 Claims, 27 Drawing Sheets

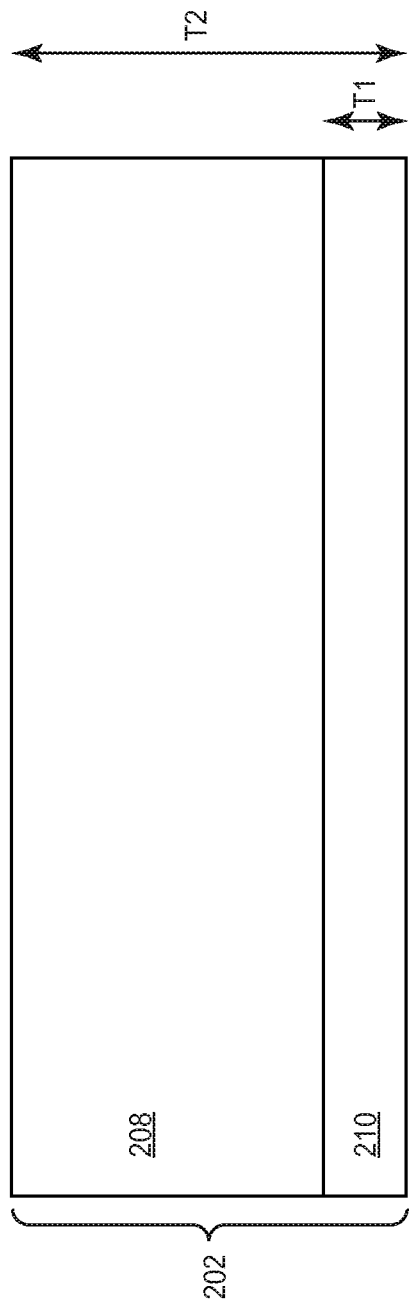

METHOD AND SUBSTRATE FOR THICK III-N EPITAXY

TECHNICAL FIELD

The instant application relates to III-N wafer structures, and more particularly to forming thick III-N wafer structures.

BACKGROUND

GaN offers several superior characteristics over Si as a semiconductor material for fabricating devices, such as lower threshold voltage, lower on-state resistance (Rdson), lower parasitic capacitance, lower gate resistance, and better FOM (figure of merit), resulting in tremendous performance and size advantages over Si. With such advantages as apparent motivating factors, ongoing extensive efforts have been made in the semiconductor industry to improve the crystal quality of GaN. For example, GaN typically has a high defect density attributable to slip lines resulting from lattice mismatch between the growth substrate and the GaN epitaxy e.g. −17% in the case of GaN on Si(111). Reducing defect density caused by slip lines yields an improvement of device performance in many cases, e.g. power devices such as GaN-based HEMTs (high electron mobility transistors). In addition to the GaN epitaxy itself, the underlying buffer layer(s) should also have good crystal quality. Acceptable GaN crystal quality has been realized to date by using Si growth substrates which are relatively inexpensive. GaN crystal quality improves by increasing the thickness of the deposited GaN layer.

However, the maximum thickness of GaN grown on Si is limited by the difference in coefficient of thermal expansion (CTE) between the two materials. The CTE of GaN ranges from $5.6*10^{-6}/K$ to $6.2*10^{-6}/K$ depending on the source. Si has a CTE of $2.6*10^{-6}/K$. Deposition of GaN is typically done at temperatures around 1000° C. (e.g. 1000-1200° C. for MOCVD—metal organic chemical vapor deposition). The deposited GaN layer cracks during subsequent cooling if made too thick due to the severe tensile stress induced by the smaller CTE of Si. The maximum thickness of GaN deposited on Si is therefore in the range of 6-8 µm. If thicker GaN layers are needed, more expensive substrates are conventionally used such as SiC, sapphire or very rare (pure) GaN substrates.

SUMMARY

According to an embodiment of a method of manufacturing an III-N substrate, the method comprises: bonding a Si substrate to a support substrate, the Si substrate having a (111) growth surface facing away from the support substrate; thinning the Si substrate at the (111) growth surface to a thickness of 100 µm or less; and forming III-N material on the (111) growth surface of the Si substrate after the Si substrate is thinned. The support substrate has a coefficient of thermal expansion more closely matched to that of the III-N material than the Si substrate.

According to an embodiment of a semiconductor wafer structure, the wafer structure comprises a substrate, Si material on the substrate, the Si material having a thickness of 100 µm or less and a (111) Si surface facing away from the substrate, and III-N material on the (111) Si surface of the Si material. The substrate has a coefficient of thermal expansion more closely matched to that of the III-N material than the Si material.

According to another embodiment of a method of manufacturing an III-N substrate, the method comprises: providing a first substrate having a first surface and a second surface opposing the first surface; forming an III-N material of a first thickness on the first surface of the first substrate; removing the first substrate after the III-N material is formed at the first thickness; bonding a second substrate to a side of the III-N material, the second substrate having a coefficient of thermal expansion more closely matched to that of the III-N material than the first substrate; and increasing the thickness of the III-N material to a second thickness greater than the first thickness after the first substrate is removed and the second substrate is bonded to the III-N material. The first thickness of the III-N material is sufficient to ensure that the second substrate has no influence on the crystal structure of the III-N material when the thickness of the III-N material is increased from the first thickness to the second thickness.

According to an embodiment of a GaN wafer, the GaN wafer comprises GaN material. The GaN material has a diameter of at least 200 mm and a thickness of at least 10 µm.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings:

FIGS. 9A through 9H illustrate sectional views of a semiconductor wafer structure during different stages of a method of manufacturing III-N material in different stages according to an embodiment.

DETAILED DESCRIPTION

Embodiments described herein provide for the deposition of relatively thick GaN layers e.g. 10 µm or more thick of good crystal quality. The same processes described herein can yield thinner GaN layers if desired. In each case, inexpensive substrates such as Si can be used to deposit GaN layers of different thicknesses. Si substrates are of particular interest due to wide availability in large diameters e.g. ranging from 200 mm (so-called '8 inch') to 300 mm (so-called '12 inch') or even larger such as 450 mm (so-called '18 inch'). High crystal quality III-N material which yields better device characteristics can be realized using the embodiments described herein. Also the maximum voltage between the device and substrate is no longer limited according to the embodiments described herein, which can be of particular interest since the superior characteristics of GaN are best suited for devices with high breakdown voltage.

Described next are embodiments which involve bonding a growth substrate for III-N material to a support substrate that is better CTE-matched to the III-N material than the growth substrate, and thinning the growth substrate so that only a thin growth layer remains e.g. about 100 μm or less. The thin growth layer determines the lattice of the subsequently deposited III-N layer and the support substrate limits stress problems during cooling down after the III-N epitaxy. In some embodiments, the growth layer on the support substrate can be structured in a way which is beneficial for the subsequent III-N epitaxy and/or reduces stress.

Figure 1A:
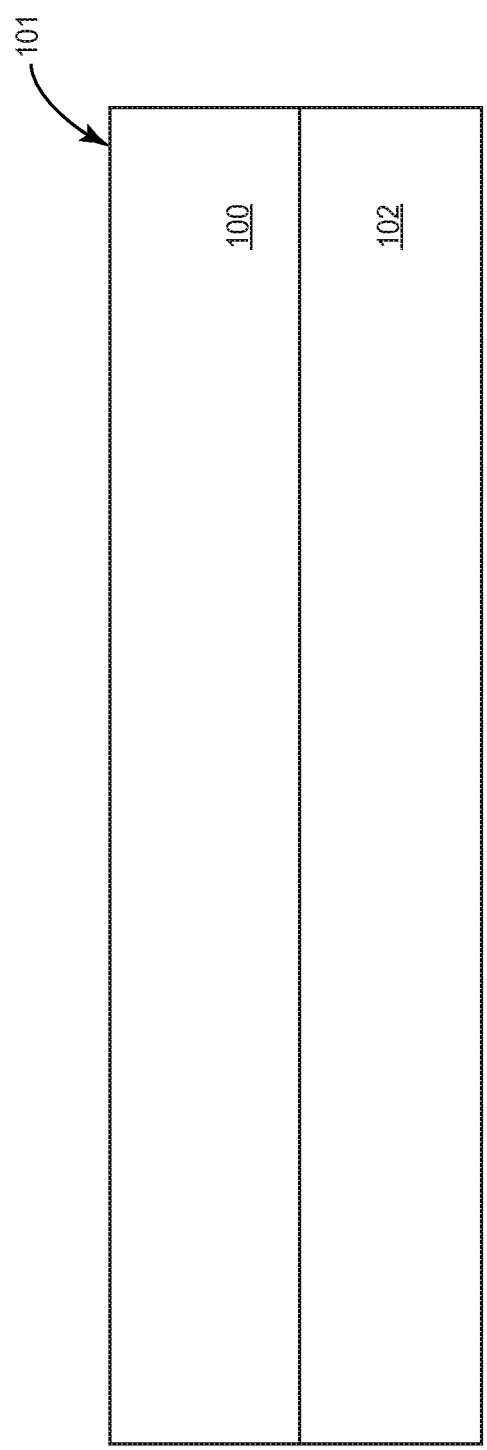
FIGS. 1A through 1C illustrate sectional views of a semiconductor wafer structure during different stages of a method of manufacturing III-N material on a growth substrate according to an embodiment.
Figure 1B:
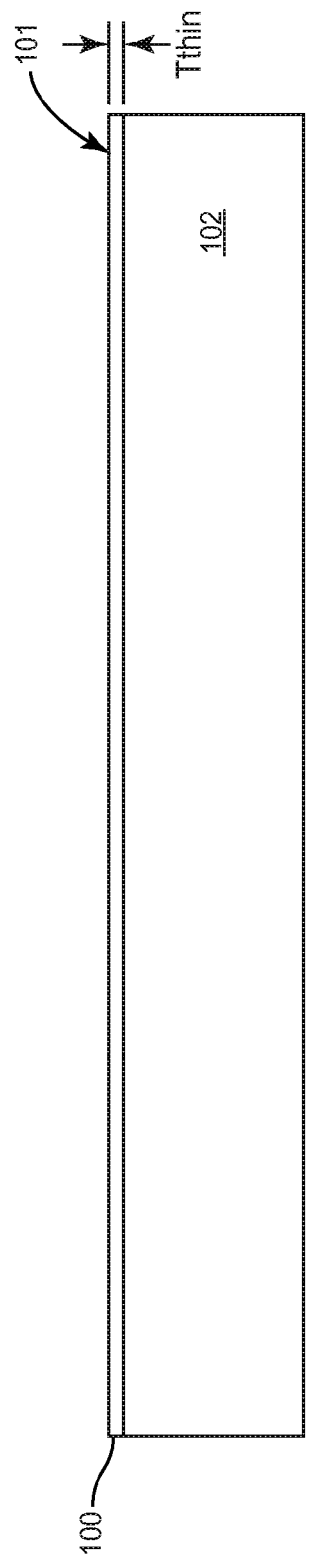
Figure 1C:
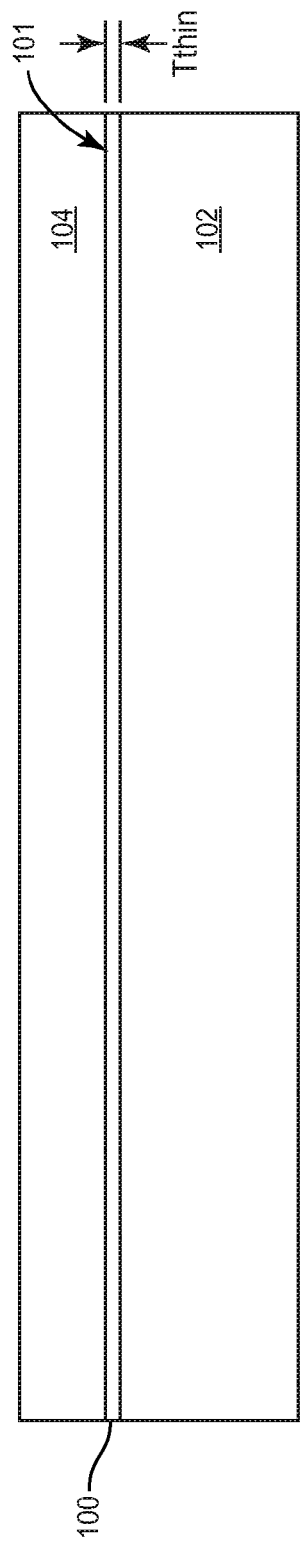

FIGS. 1A through 1C illustrate corresponding sectional views of a semiconductor wafer structure during different stages of a manufacturing process according to an embodiment. According to this embodiment, a Si substrate 100 is bonded to a support substrate 102 using any suitable known bonding process as shown in FIG. 1A. The Si substrate 100 has a (111) growth surface 101 (or other orientation) facing away from the support substrate 102, and the substrates 100, 102 have different CTEs. The Si substrate 100 is thinned at the (111) growth surface 101 to a thickness (Tthin) of 100 μm or less e.g. 10 μm or less using any suitable known thinning process such as wet chemical etching, CMP (chemical mechanical polishing), etc. as shown in FIG. 1B. Thermal expansion which occurs during subsequent formation of III-N material on the thinned Si substrate 100 is dominated by the support substrate 102 instead of by the Si substrate 100 because the Si substrate 100 is significantly thinner (and therefore has much less bulk) than the support substrate 102. This in turn reduces the likelihood of cracking of the III-N material because the support substrate 102 is selected so that the CTE of the support substrate 102 is relatively well matched to that of the III-N material, or at least more closely matched to the III-N material than the thinned Si substrate 100.

After the Si substrate 100 is thinned, the III-N material 104 such as GaN, AlN, InN, etc. is formed on the (111) growth surface 101 of the thinned Si substrate 100 using any suitable known process such as MOCVD as shown in FIG. 1O. The III-N material 104 is less prone to cracking during subsequent cooling, because the support substrate 102 has a CTE more closely matched to that of the III-N 104 material than the Si substrate 100 and the Si substrate 100 was thinned prior to formation of the III-N material 104. With such an III-N growth process, some structural damage can still arise in the resulting III-N material 104 (also cracks in the Si layer would be minimized). To prevent the possible occurrence of such structural damage, the thinned Si substrate 100 can be structured prior to formation of the III-N material 104 in a way which is beneficial for the III-N epitaxy and/or reduces stress.

Figure 2A:
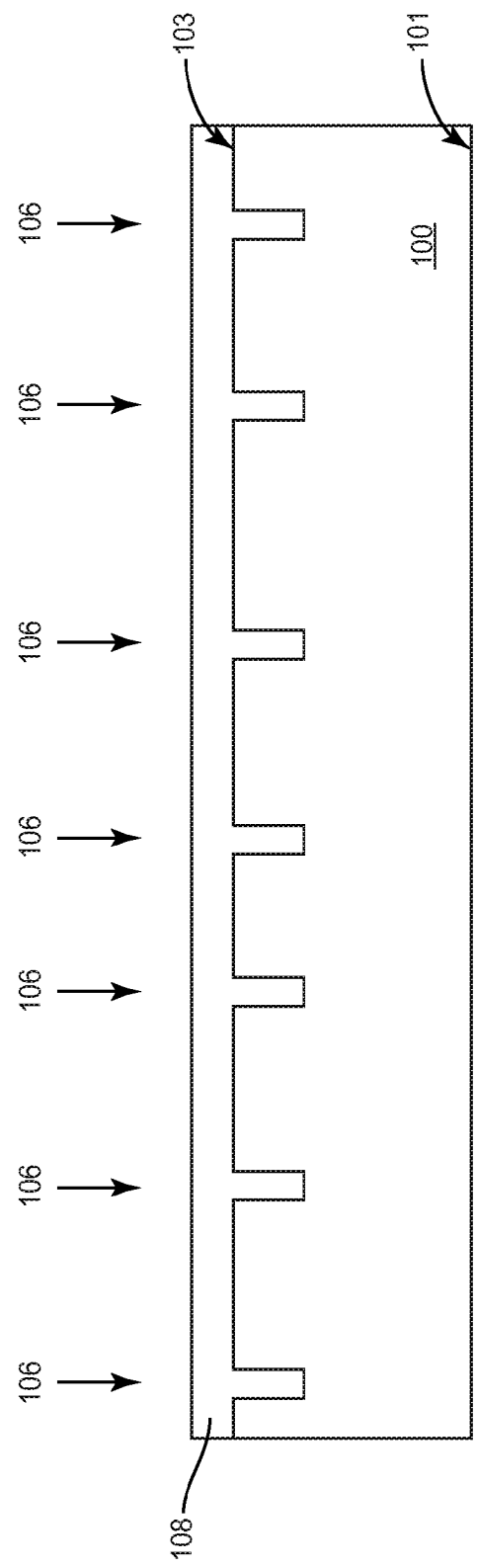
FIGS. 2A through 2E illustrate sectional views of a semiconductor wafer structure during different stages of a method of manufacturing III-N material on a structured growth substrate according to a first embodiment.

FIGS. 2A through 2E illustrate corresponding sectional views of a semiconductor wafer structure during different stages of a manufacturing process in which the Si substrate 100 is structured prior to formation of the III-N material 104, according to a first embodiment. FIG. 2A shows the Si substrate 100 after trenches 106 are formed in the Si substrate 100 at a bonding surface 103 of the Si substrate 100 facing away from the (111) growth surface 101. The trenches 106 can be formed in active regions and/or kerf regions (also commonly referred to as scribe lines) of the Si substrate 100. Any known suitable process such as etching can be employed to form the trenches 106. The trenches 106 are at least partly filled with a material 108 such as a dielectric (e.g. $SiO_2$) before the Si substrate 100 is bonded to the support substrate 102 at the bonding surface 103. The material 108 fills the trenches 160 and also covers the bonding surface 103 of the Si substrate 100 according to this embodiment. Alternatively, the trenches 106 can remain open at the time of bonding to the support substrate 102 and later filled before III-N deposition.

Figure 2B:
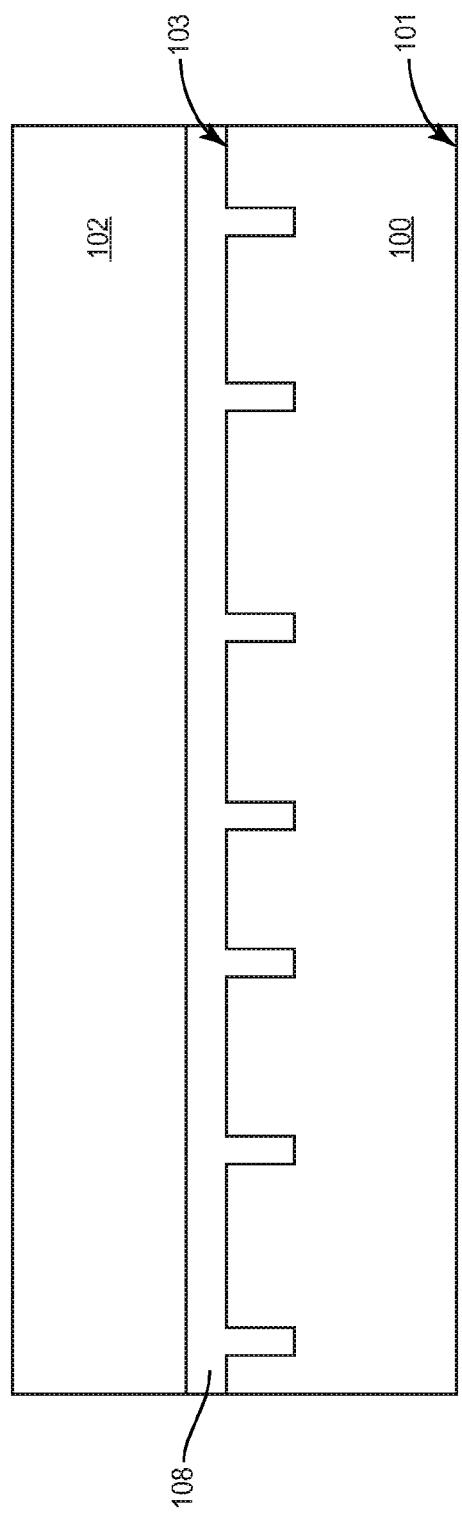

FIG. 2B shows the semiconductor wafer structure after the support substrate 102 is bonded to the material 108 covering the bonding surface 103 of the Si substrate 100. Any suitable support substrate 102 can be used so long as the support substrate 102 has a CTE more closely matched to the CTE of the III-N material 104 to be formed on the Si substrate 100 than to the CTE of the Si substrate 100.

Figure 2C:
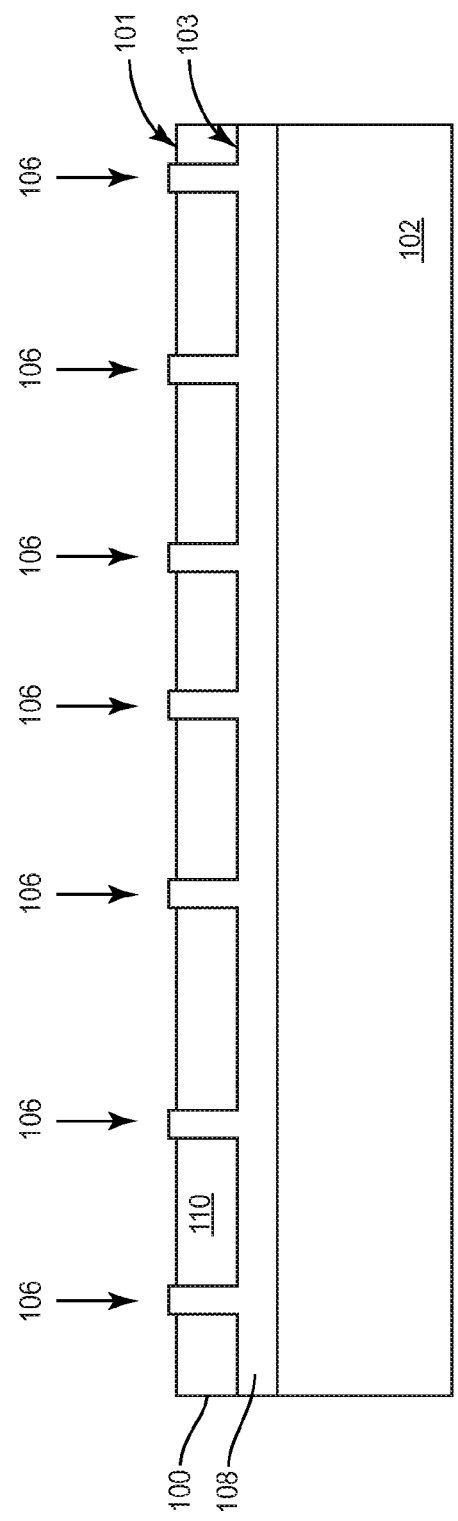

FIG. 2C shows the semiconductor wafer structure after the Si substrate 100 is thinned at the (111) growth surface 101 of the Si substrate 100. The Si substrate 100 is thinned to a thickness of 100 μm or less e.g. 10 μm or less to limit stress on the III-N material 104 to be subsequently formed. According to this embodiment, thinning of the Si substrate 100 results in the trenches 106 being exposed at both the (111) growth surface 101 and the bonding surface 103 so that the thinned Si substrate 100 is separated into islands of Si material 110. Alternatively, the trenches 106 can be exposed only at the (111) growth surface 101 so that the thinned Si substrate 100 is not fully separated into islands i.e. the thinned Si substrate 100 remains continuous near the bonding surface 103.

Figure 2D:
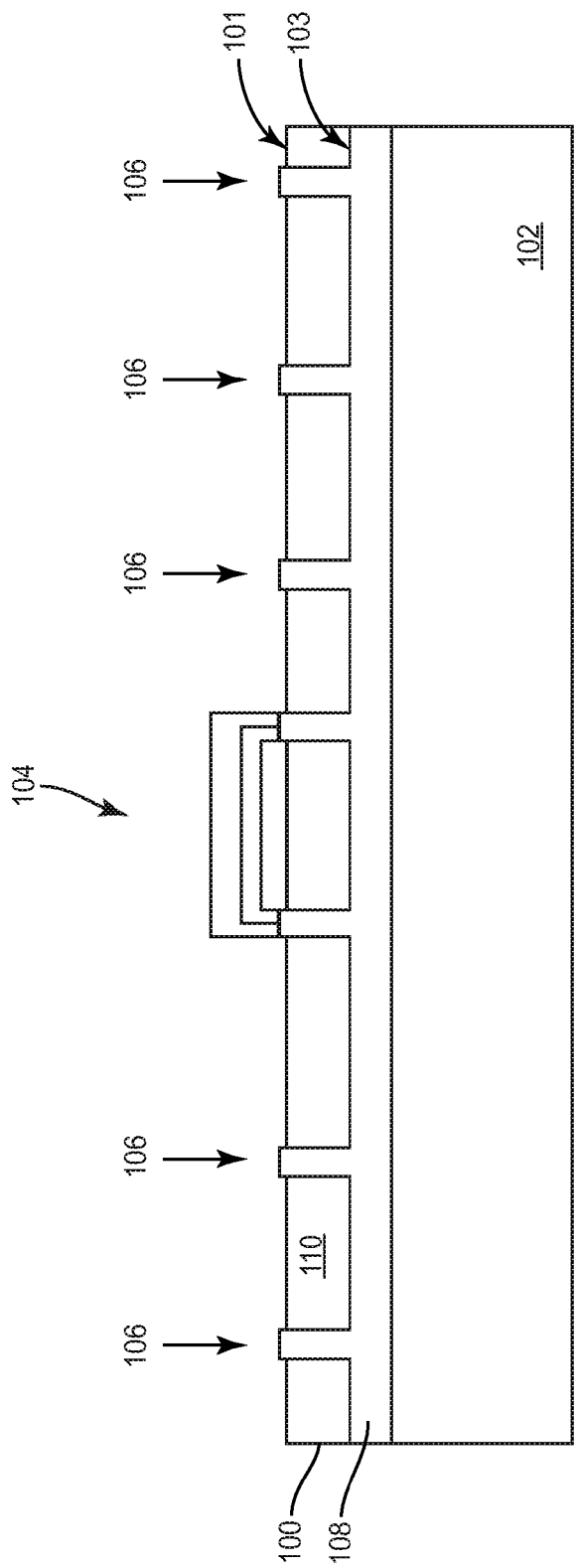

FIG. 2D shows the semiconductor wafer structure during deposition of the III-N material 104 e.g. by an MOCVD-based epitaxial lateral overgrowth (ELOG) process. The III-N material 104 (e.g. GaN with one or more buffer layers) deposits on the exposed (111) growth surface 101 of the thinned Si substrate 100. Small voids may form on the dielectric material 108 in the trenches 106. The III-N material 104 continues to grow both vertically and horizontally (laterally) on the Si islands 110 as illustrated by the different sized rectangular boxes shown in FIG. 2D. The III-N material 104 of course grows in this way over all of the Si islands 110, even though FIG. 2D shows the growth over just one of the islands 110 for ease of illustration.

Figure 2E:
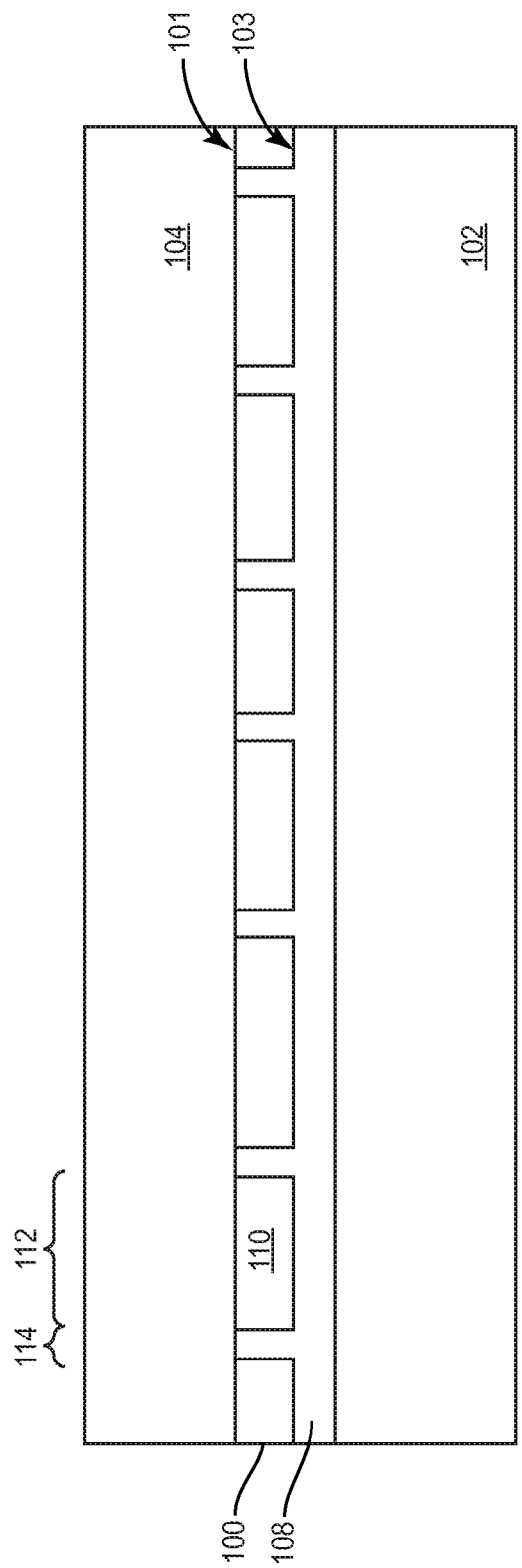

FIG. 2E shows the semiconductor wafer structure after the III-N material 104 is deposited on the thinned Si substrate 100 to any desired thickness e.g. 10 μm or thicker. Thermal expansion which occurs during formation of the III-N material 104 is dominated by the thicker support substrate 102 instead of the thinned Si substrate 100. Thinning the Si substrate 100 prior to deposition of the III-N material 104 together with the trench structures 106 formed in the thinned Si substrate 100 reduces the likelihood of cracking of the III-N material 104, because the CTE of the support substrate 102 is closer to that of the III-N material 104 than the thinned Si substrate 100. The majority of slip-lines which result in the III-N material 104 tend to be disposed over the Si islands 110 and not the trenches 106. As such, first regions 112 of the III-N material 104 over the Si islands 110 have a higher density of slip lines than second regions 114 of the III-N material 104 over the trenches 106. Devices can be formed in the second regions 114 of the III-N material 104 i.e. the regions with a lower density of slip lines to ensure better device performance. In this case, it would be beneficial to form the trenches 106 wider than the Si islands 110. However for relatively thin layers as compared to the thickness of the III-N layer 104, forming the Si islands 110 wider than the trenches 106 yields better planarity.

Figure 3A:
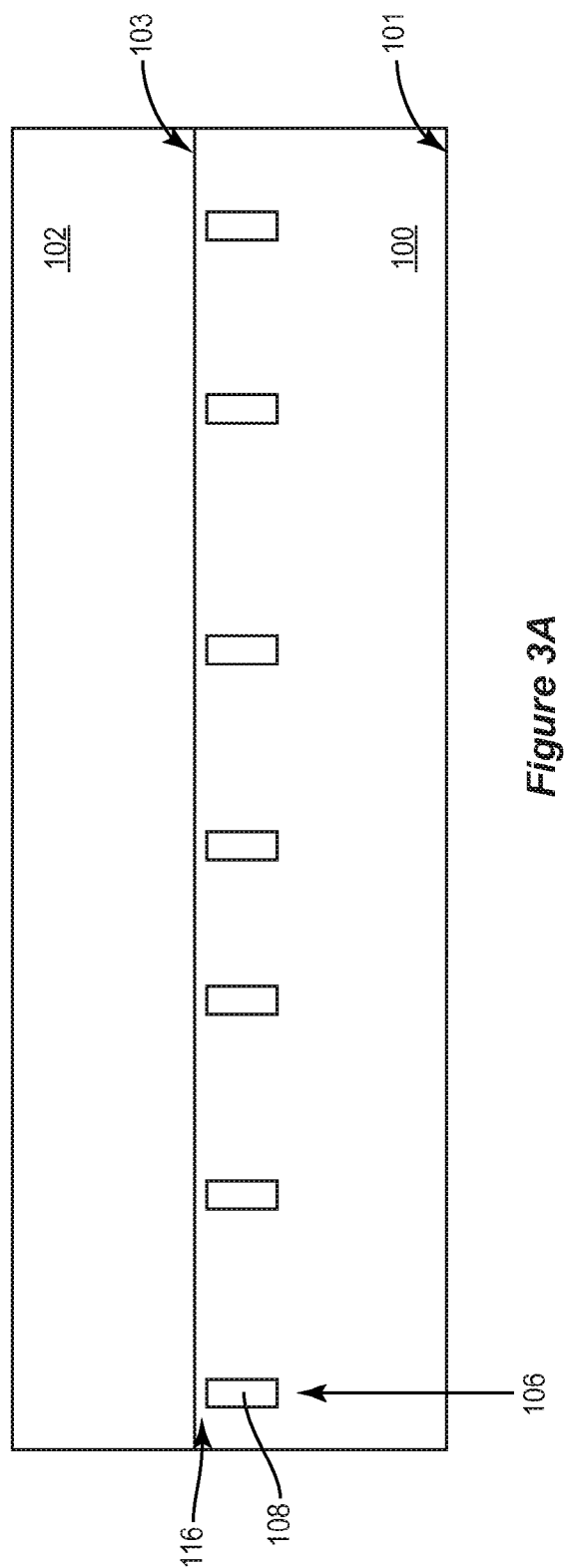
FIGS. 3A through 3C illustrate sectional views of a semiconductor wafer structure during different stages of a method of manufacturing III-N material on a structured growth substrate according to a second embodiment.
Figure 3B:
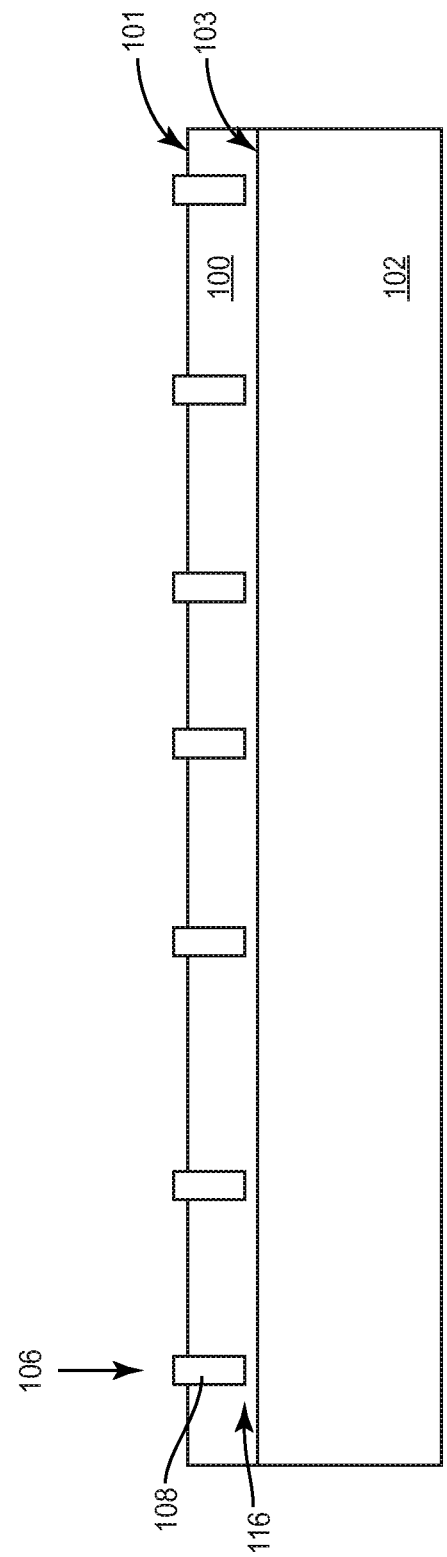
Figure 3C:
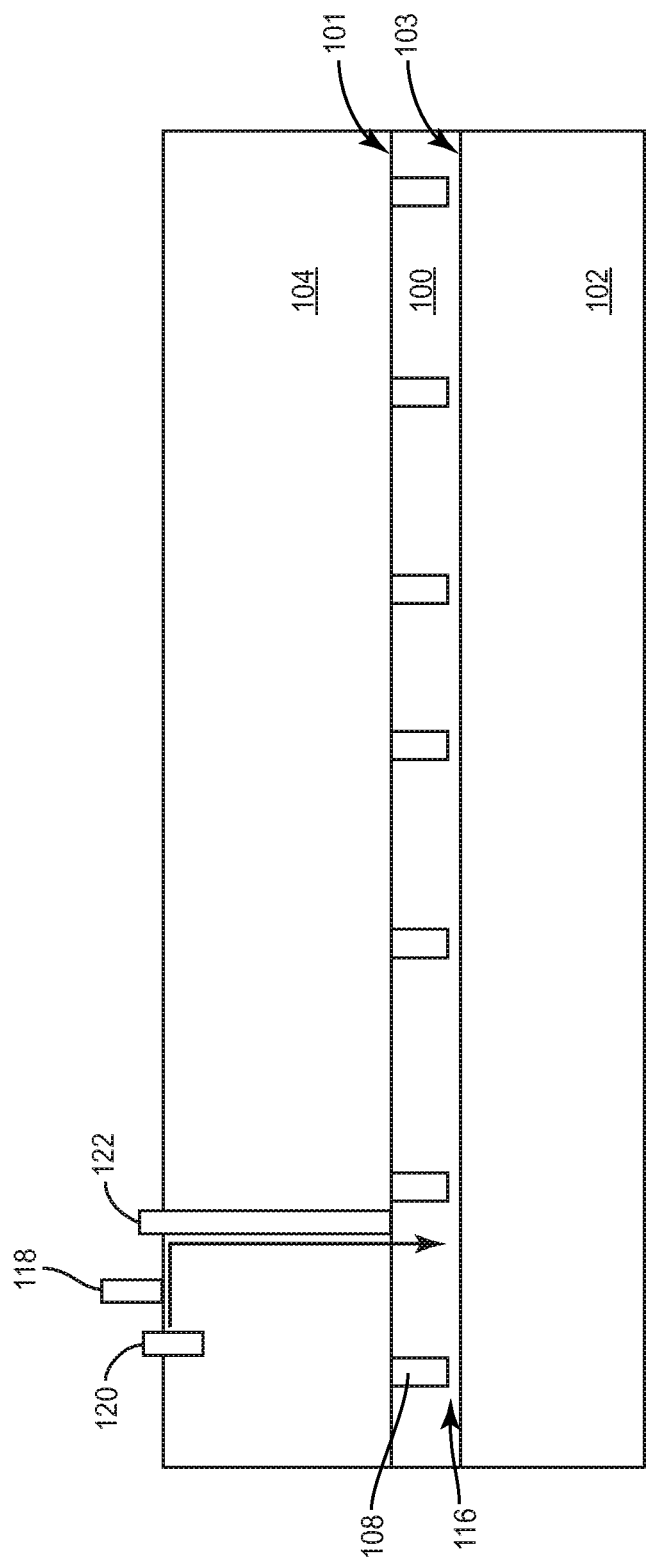

FIGS. 3A through 3C illustrate corresponding sectional views of a semiconductor wafer structure during different stages of a manufacturing process in which the Si substrate 100 is structured prior to formation of the III-N material 104, according to a second embodiment. FIG. 3A shows the Si substrate 100 after trenches 106 are formed in the Si substrate 100 at the bonding surface 103 of the substrate 100 facing away from the (111) growth surface 101, the material 108 filling the trenches 106 is removed from the bonding surface 103 of the Si substrate 100, and additional (optional) Si 116 is formed at the bonding surface 103 of the Si substrate 100 e.g. by epitaxy after the material 108 is removed from the bonding surface 103. If the optional additional Si layer 116 is provided, the material 108 in the trenches 106 is surrounded on all sides by Si and the support substrate 102 bonded to the Si substrate 100 is separated from the material 108 in the trenches 106 by the additional Si layer 116 as shown in FIG. 3A.

FIG. 3B shows the semiconductor wafer structure after the Si substrate 100 is thinned at the (111) growth surface 101 of the Si substrate 100. The Si substrate 100 is thinned at the (111) growth surface 101 to a thickness of 100 μm or less e.g. 10 μm or less. According to this embodiment, thinning of the Si substrate 100 results in the trenches 106 being exposed only at the (111) growth surface 101 so that the Si substrate 100 is not separated into islands of Si material (if the optional Si layer 116 is grown) after thinning. Such a structure is realized by the growth of the additional Si layer 116 after trench formation.

FIG. 3C shows the semiconductor wafer structure after the III-N material 104 is formed e.g. by MOCVD on the thinned Si substrate 100 to any desired thickness e.g. 10 μm or thicker. This embodiment is well-suited for quasi-vertical devices i.e. devices having a current path with a lateral component and a vertical component as represented by the arrow in FIG. 3C. Such devices have a gate 118 which controls the underlying channel, and two terminals 120, 122 spaced apart by the channel. Either terminal 120, 122 (i.e. the source or drain) of the device extends to the underlying thinned Si substrate 100 which can be doped so that the thinned Si substrate 100 is electrically conductive. Because the insulating material 108 filling the trenches 106 was previously removed from the bonding surface 103 of the Si substrate 100, the current path continues unobstructed to the doped Si substrate 100 according to this embodiment.

Figure 4:
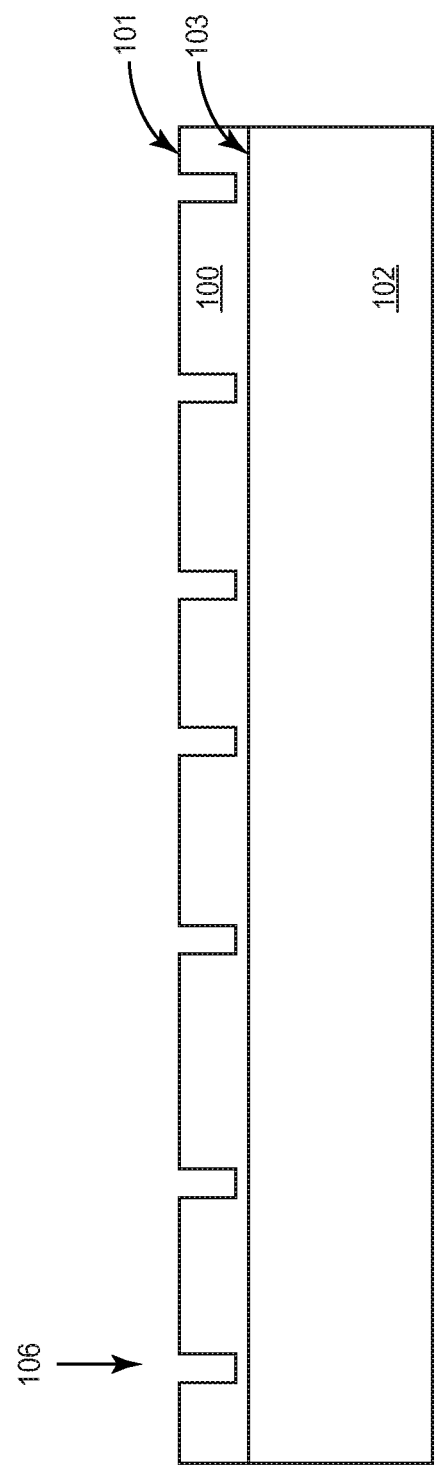
FIG. 4 illustrates a sectional view of a structured substrate for growing III-N material according to a third embodiment.

FIG. 4 illustrates a third embodiment where the trenches 106 in the thinned Si substrate 100 are not filled with any material prior to deposition of the III-N material 104. As such, the trenches 106 remain open at the (111) growth surface 101 of the Si substrate 100 when the III-N material 104 begins forming on the (111) growth surface 101. The trenches 106 can be etched all the way to the underlying support substrate 102 to form islands (dies) of Si completely separated from one another. During subsequent high-temperature MOCVD processing to form the III-N material 104, only individual island (die) stresses are present and not entire wafer stress. This in turn leads to less wafer bow and therefore a thicker Si substrate 100 can be used to support the growth of the III-N material 104. Of course, smaller wafer bow has multiple benefits: less risk of cracks; easier handling; etc.

Figure 5A:
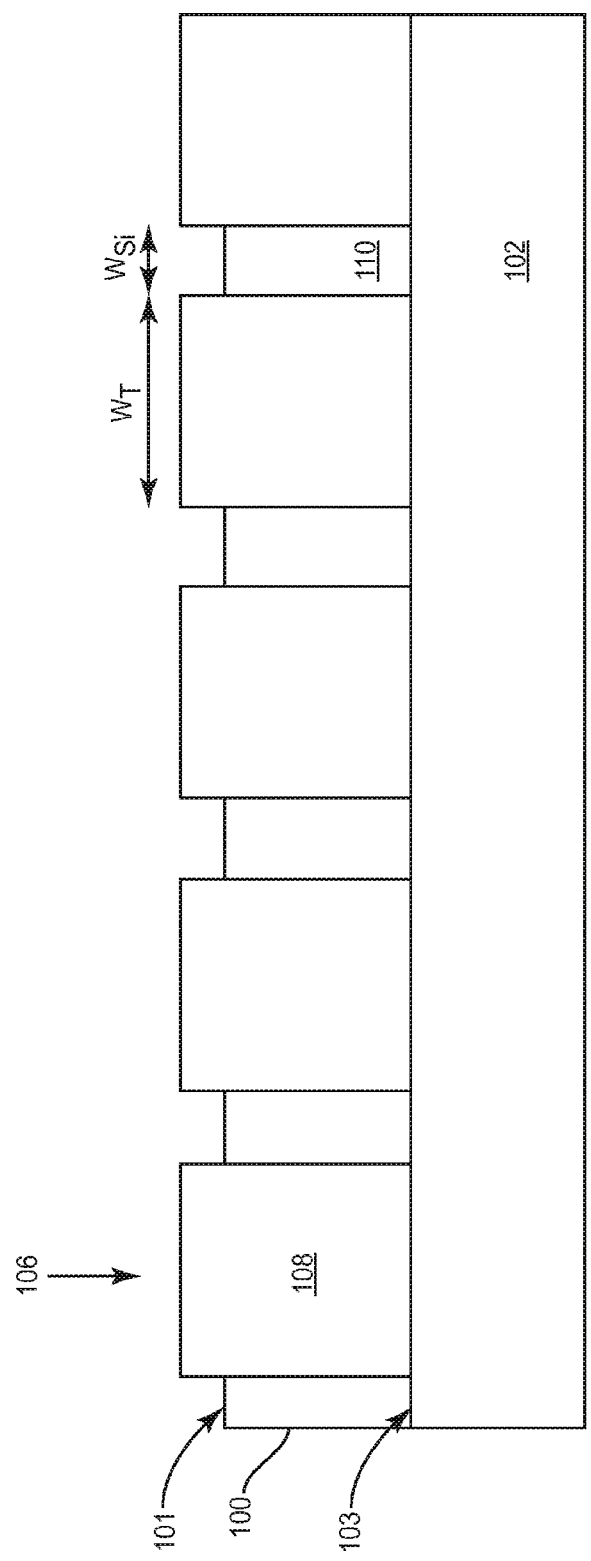
FIGS. 5A through 5C illustrate sectional views of a semiconductor wafer structure during different stages of a method of manufacturing III-N material on a structured growth substrate according to a fourth embodiment.
Figure 5B:
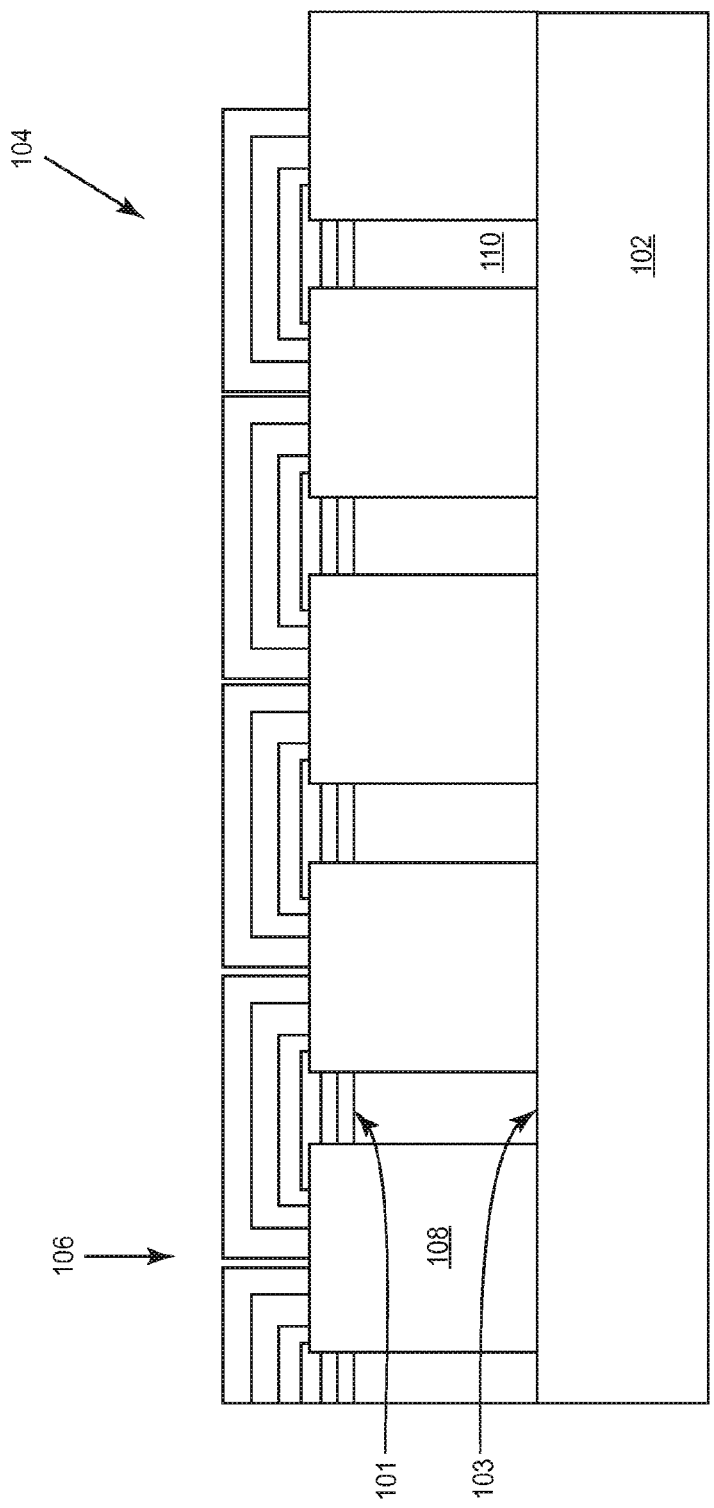
Figure 5C:
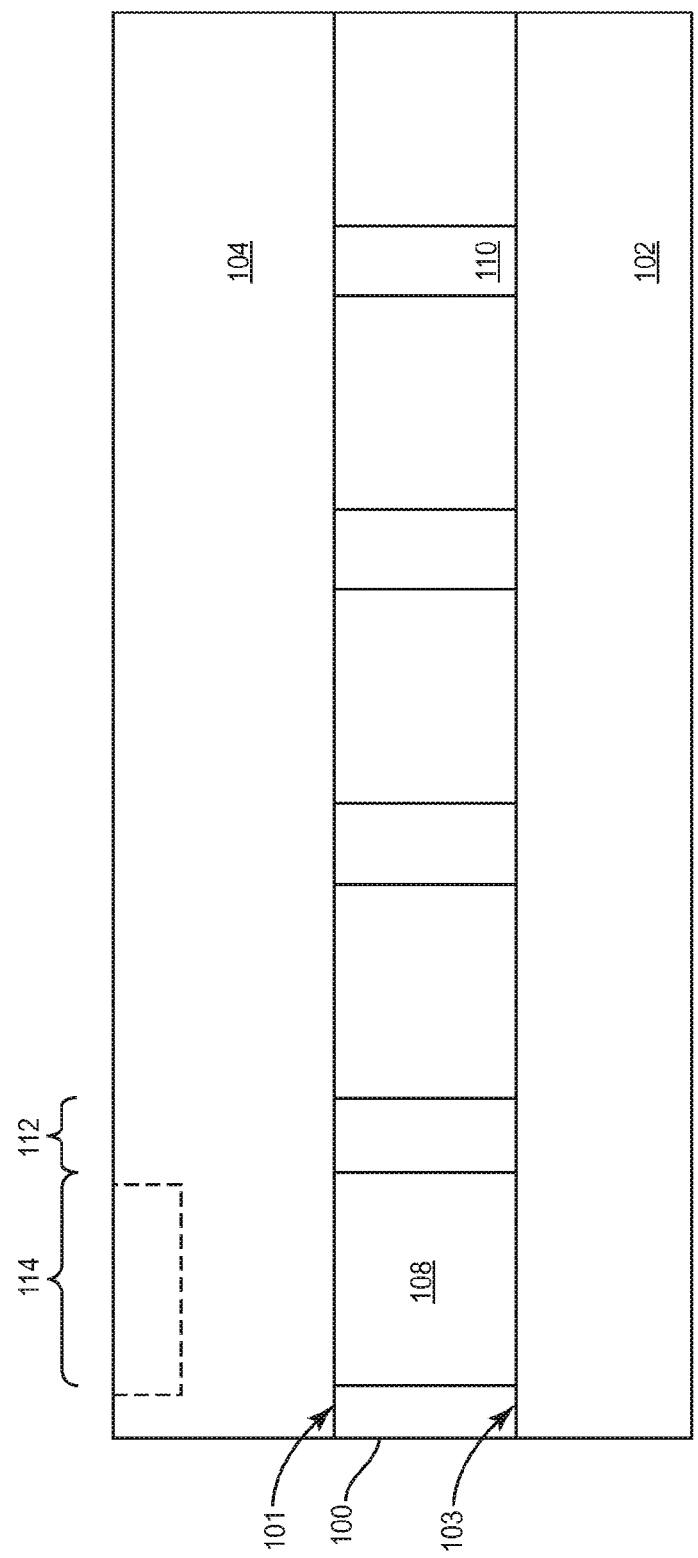

FIGS. 5A through 5C illustrate corresponding sectional views of a semiconductor wafer structure during different stages of a manufacturing process in which the Si substrate 100 is structured prior to formation of the III-N material 104, according to a fourth embodiment. FIG. 5A shows the Si substrate 100 after trenches 106 are formed in the Si substrate 100 at the bonding surface 103 and the trenches 106 are filled with a material 108. According to this embodiment, the width ($W_T$) of the trenches 106 is greater than the width ($W_{Si}$) of the Si islands 110 between the trenches 106 and the trenches 106 are filled with a dielectric material 108 such as $SiO_2$. The dielectric-filled trenches 106 are broader than the narrow Si islands 110 interposed between the trenches 106. Such a structure is well suited for MOCVD-based ELOG.

FIG. 5B shows the semiconductor wafer structure during ELOG of the III-N material 104 on the (111) growth surface 101 of the Si islands 110. The different sized rectangular boxes in FIG. 5B represent the lateral growth of the III-N material 104 at different stages of the ELOG process. The III-N material 104 eventually grows over the wide dielectric-filled trenches 106.

FIG. 5C shows the semiconductor wafer structure after the III-N material 104 is completely formed. As explained previously herein, the majority of slip-lines in the III-N material 104 resulting from the epitaxial lateral overgrowth process are disposed over the Si islands 110 instead of the dielectric-filled trenches 106. Accordingly, active device regions represented by the dashed box in FIG. 5C can be formed in the regions 114 of the III-N material 104 disposed over the dielectric-filled trenches 106 where the slip-line density is lower. The regions 112 of the III-N material 104 over the Si islands 110 can be used e.g. as device isolation regions or as inactive regions later used to separate the dies.

Figure 6A:
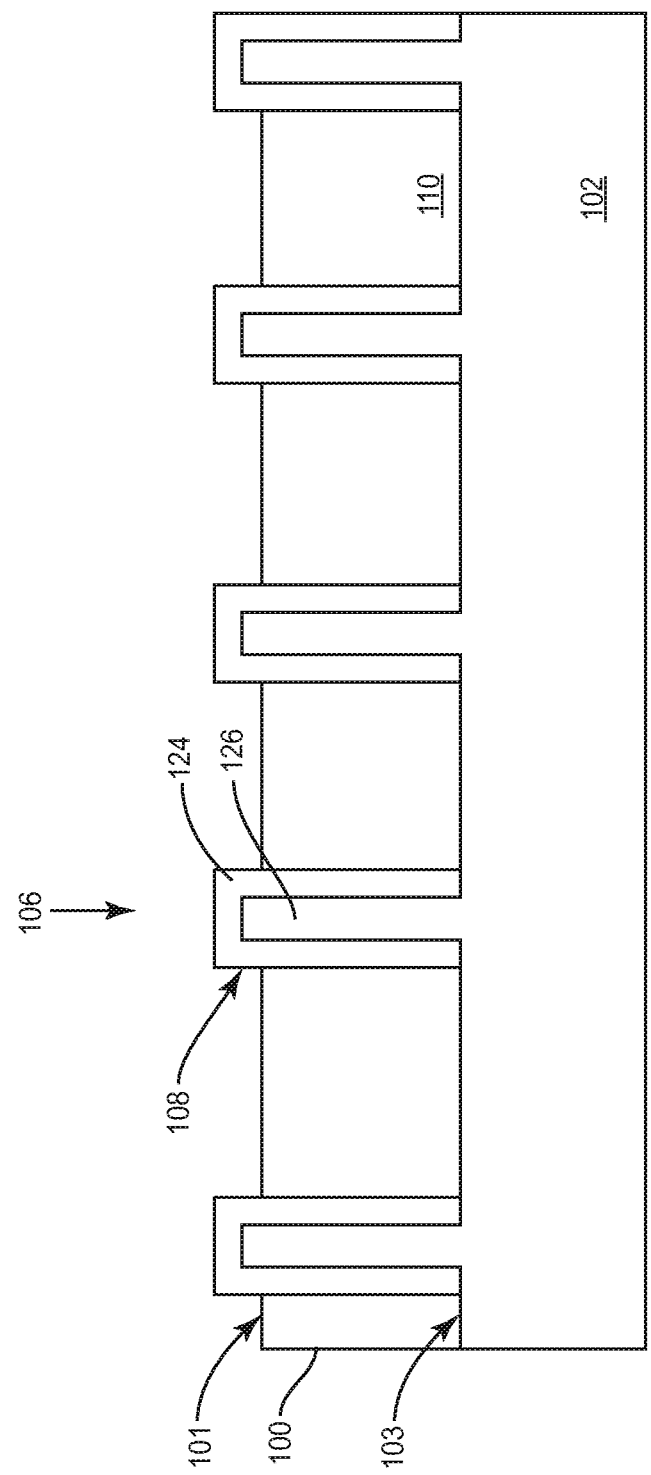
FIGS. 6A and 6B illustrate sectional views of a semiconductor wafer structure during different stages of a method of manufacturing III-N material on a structured growth substrate according to a fifth embodiment.
Figure 6B:
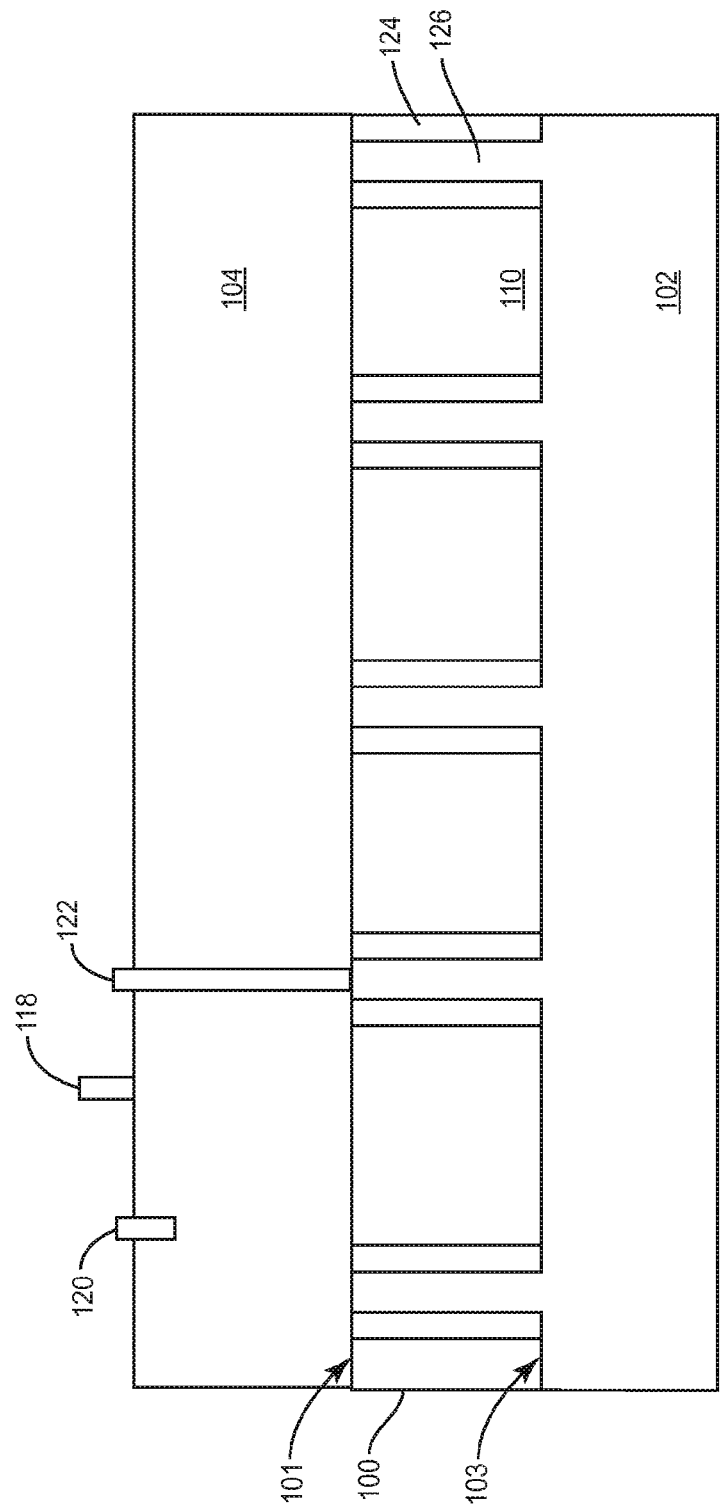

FIGS. 6A and 6B illustrate corresponding sectional views of a semiconductor wafer structure during different stages of a manufacturing process in which the Si substrate 100 is structured prior to formation of the III-N material 104, according to a fifth embodiment. FIG. 6A shows the wafer structure after the trenches 106 in the Si substrate 100 are filled with at least two different materials 124, 126. For example, the trenches 106 can be partly filled with a first dielectric 124 such as $SiO_2$ and then completely filled with a different material 126 e.g. which provides additional stress reduction/accommodation or is electrically conductive and provides a point of contact between opposing sides of the structure. In the embodiment shown in FIG. 6A, an inner part of the trenches 106 is filled with an electrically conductive material 126 such as doped Si or a metal such as W, T, TiN, metal alloy, etc. to form low-ohmic contacts. An outer part of the trenches 106 surrounding the inner part is filled with an electrically insulating material 124.

FIG. 6B shows the structure after the III-N material 104 is formed on the (111) growth surface 101 of the Si substrate 100. Quasi-vertical devices can be formed in the III-N material 104 as represented by the gate, drain and source terminals 118, 120, 122 shown in FIG. 6B. In this case, the source 122 terminal extends through the III-N material 104 to the electrically conductive inner part 126 of the trenches 106. The conductive inner part 126 of the trenches 106 provide a current path between the source terminal 122 and the underlying substrate 100 which can be heavily doped to ensure a good electrical connection. The drain terminal 120 instead can be electrically connected to the doped Si substrate 100 via the conductive inner part 126 of the trenches 106 instead of the source terminal 122.

Figure 7:
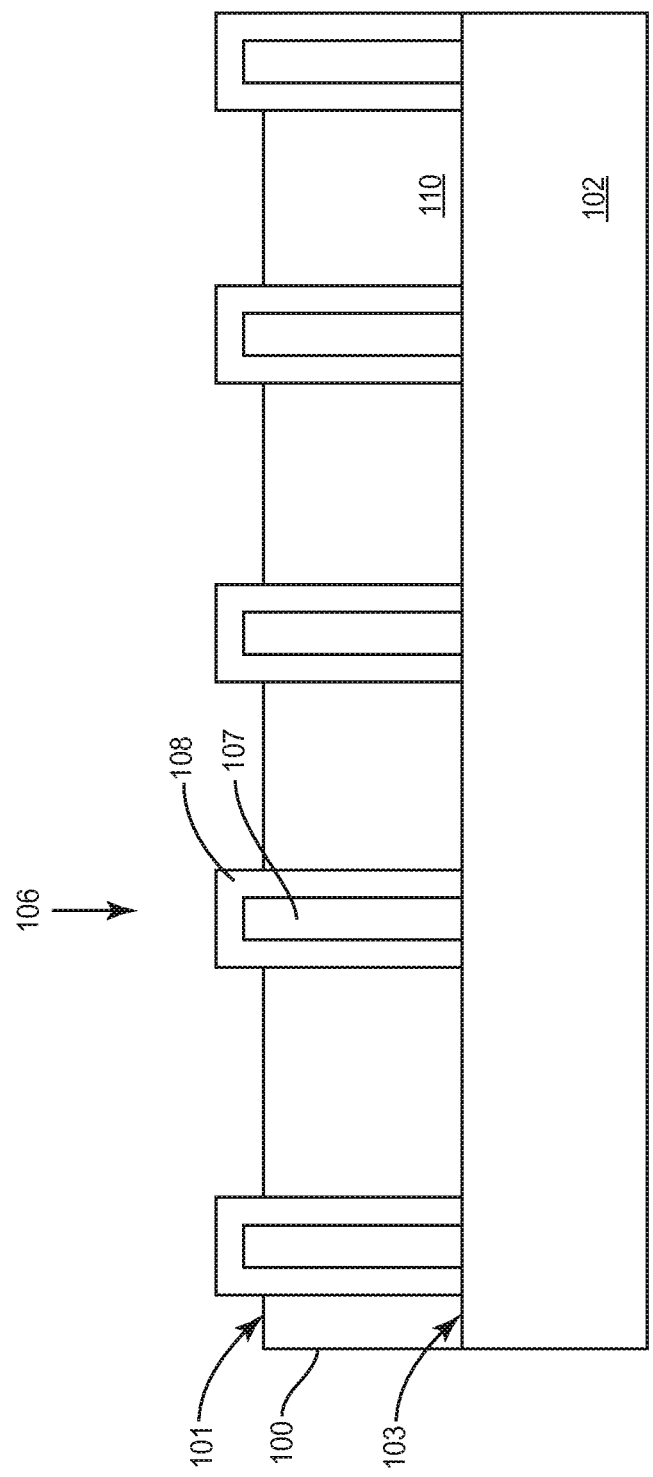
FIG. 7 illustrates a sectional view of a structured substrate for growing III-N material according to a sixth embodiment.

FIG. 7 illustrates a sectional view of a structured Si substrate 100 prior to formation of III-N material 104 on the Si substrate 100, according to a sixth embodiment. The material 108 partly fills the trenches 106 in the Si substrate 100 by lining the sidewalls and top of each trench 106 so that the trenches 106 are enclosed. The enclosed inner part 107 of the trenches 106 is filled with a gas. The III-N material 104 grows on the exposed parts of the Si substrate 100 along the (111) growth surface 101, eventually growing over the enclosed trenches 106.

Figure 8:
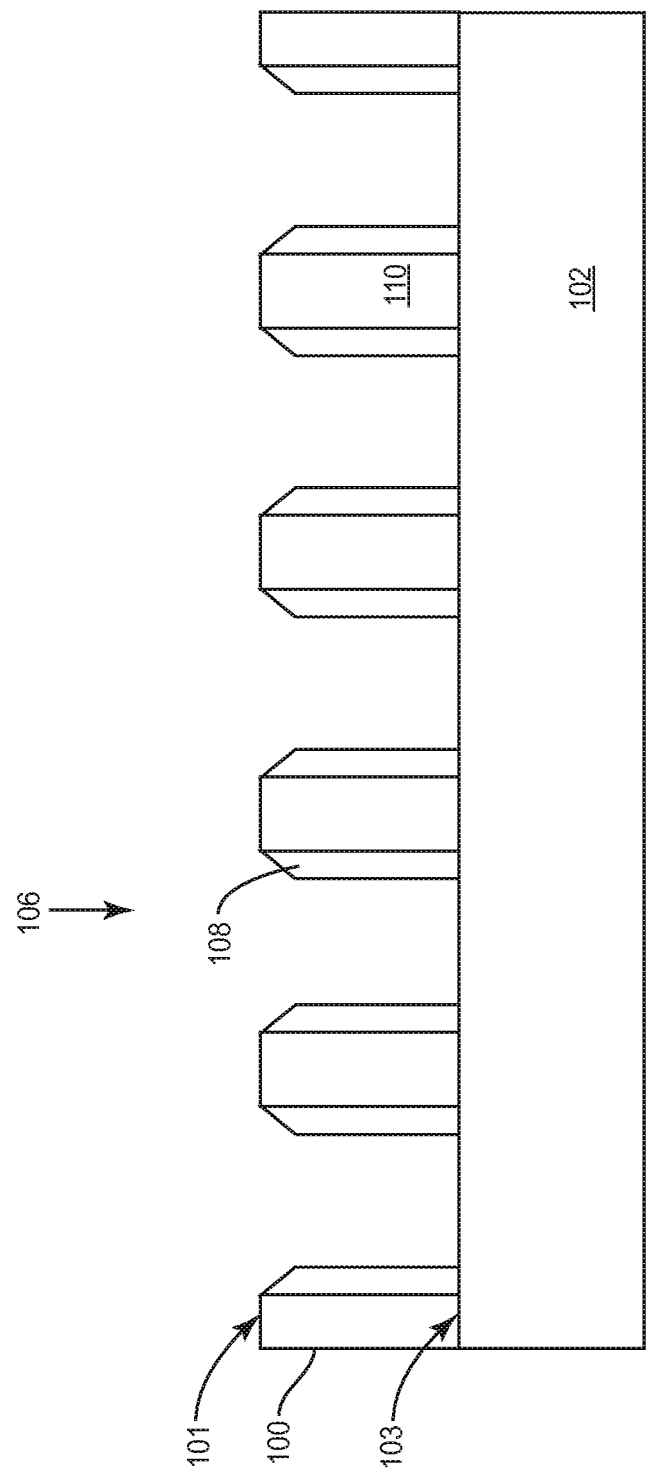
FIG. 8 illustrates a sectional view of a structured substrate for growing III-N material according to a seventh embodiment.

FIG. 8 illustrates a sectional view of a structured Si substrate 100 prior to formation of III-N material 104 on the Si substrate 100, according to a seventh embodiment. The embodiment shown in FIG. 8 is similar to the one shown in FIG. 7, however, the material 108 lining the sidewalls of the trenches 106 does not enclose the trenches 106. Instead, the trenches 106 remain open at the (111) growth surface 101 of the Si substrate 100 during the III-N formation process.

According to each of the previously described embodiments, a semiconductor wafer structure is provided which comprises a substrate, Si material on the substrate, the Si material having a thickness of 100 µm or less and a (111) Si surface facing away from the substrate, and III-N material on the (111) Si surface of the Si material. The Si material can be structured or not structured. The substrate has a CTE more closely matched to that of the III-N material than the Si material. The substrate can be removed or remain in place during subsequent use in fabricating devices in the III-N material. The III-N material can be grown to any desired thickness according to the embodiments described above. In one embodiment, the III-N material is GaN and the GaN material has a diameter of at least 200 mm and a thickness of at least 10 µm. Such a wafer structure can be used e.g. for GaN-on-GaN epitaxy. In addition, several of the embodiments previously described show an overgrown dielectric. Alternatively, a larger area can be provided with the dielectric exposed so that even after overgrowth there is a significant topology that can be used as an alignment mark.

Described next are embodiments which involve using two separate deposition stages to form an III-N layer of a desired final thickness. In the first deposition stage, a growth wafer is used which is suited for growing a thin layer of III-N material such as GaN (e.g. a Si wafer can be used). The growth wafer is removed after the first deposition stage and replaced by a new substrate. The new substrate has a CTE more closely matched to the III-N material than the original growth wafer (e.g. a SiGe wafer with high Ge content or BeO can be used as the second substrate). In this way, cracking of the III-N material is avoided while the structure cools down after the multi-stage deposition process is completed. The III-N material is grown thick enough in the first deposition stage so that the second substrate has no effect on the crystal quality of the GaN during the second deposition stage.

Figure 9A:
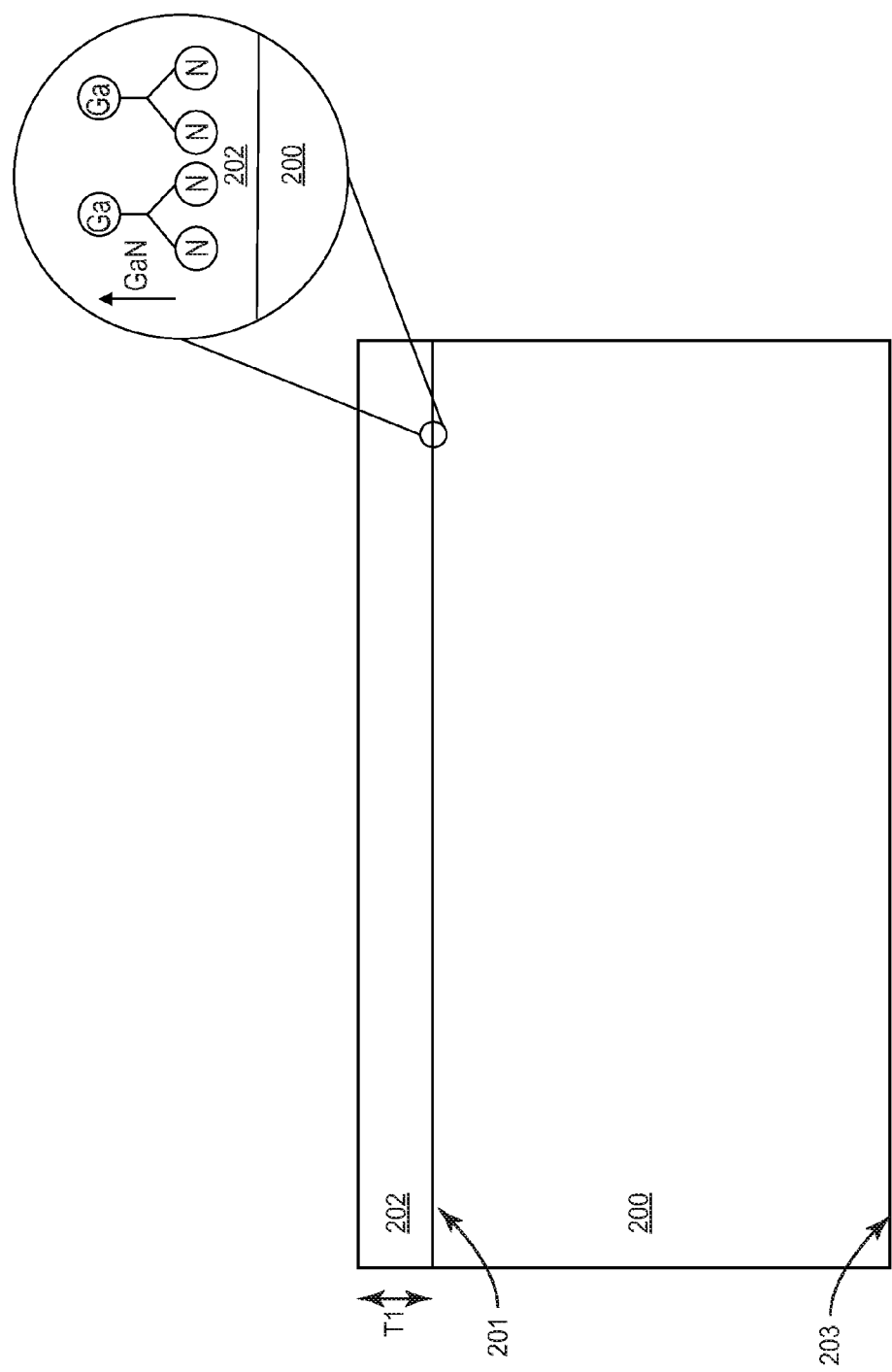

FIGS. 9A through 9H illustrate corresponding sectional views of a semiconductor wafer structure during different stages of a two-stage III-N deposition manufacturing process according to an embodiment. FIG. 9A shows a first (growth) substrate 200 with first and second opposing surfaces 201, 203 after III-N material 202 of a first thickness (T1) is formed on the first surface 201 of the growth substrate 200 e.g. by MOCVD. Any suitable III-N material 202 can be formed such as GaN, AlN, InN, etc. and/or combinations thereof. The III-N material 202 need only be thick enough to be mechanically stable during the subsequent bonding process. Steps to gradually improve crystal quality are not necessary in the first deposition stage. For example, deposition of a buffer or seed layer can be enough as the initial III-N material 202. Crystal quality optimization steps can be taken in the second deposition stage.

In one embodiment, the III-N material 202 is GaN, the growth substrate 200 is a Si wafer, and the GaN 202 (including and buffer layers such as AlN) is deposited on the (111) surface 201 (or other orientation) of the Si wafer 200. FIG. 9A includes an exploded view which shows GaN material 202 (with one or more buffer layers) deposited on the Si wafer 200. The growth direction of the GaN material 202 is represented by an upward facing arrow in FIG. 9A. Each layer of GaN 202 includes a lower layer of nitrogen (N) atoms and an upper layer of gallium (Ga) atoms as depicted in the exploded view of FIG. 9A. The common orientation for MOCVD is shown in FIG. 9A. However, the orientation can be flipped e.g. by using MBE (molecular beam epitaxy). In each case, the maximum thickness of the initial III-N material 202 is limited by the different CTEs of the III-N material 202 and the growth substrate 200. The crystal quality of the III-N material 202 improves with increased thickness, however, cracking can occur in the III-N material 202 during post-deposition cooling if the III-N material 202 is grown too thick in the first deposition stage.

Figure 9B:
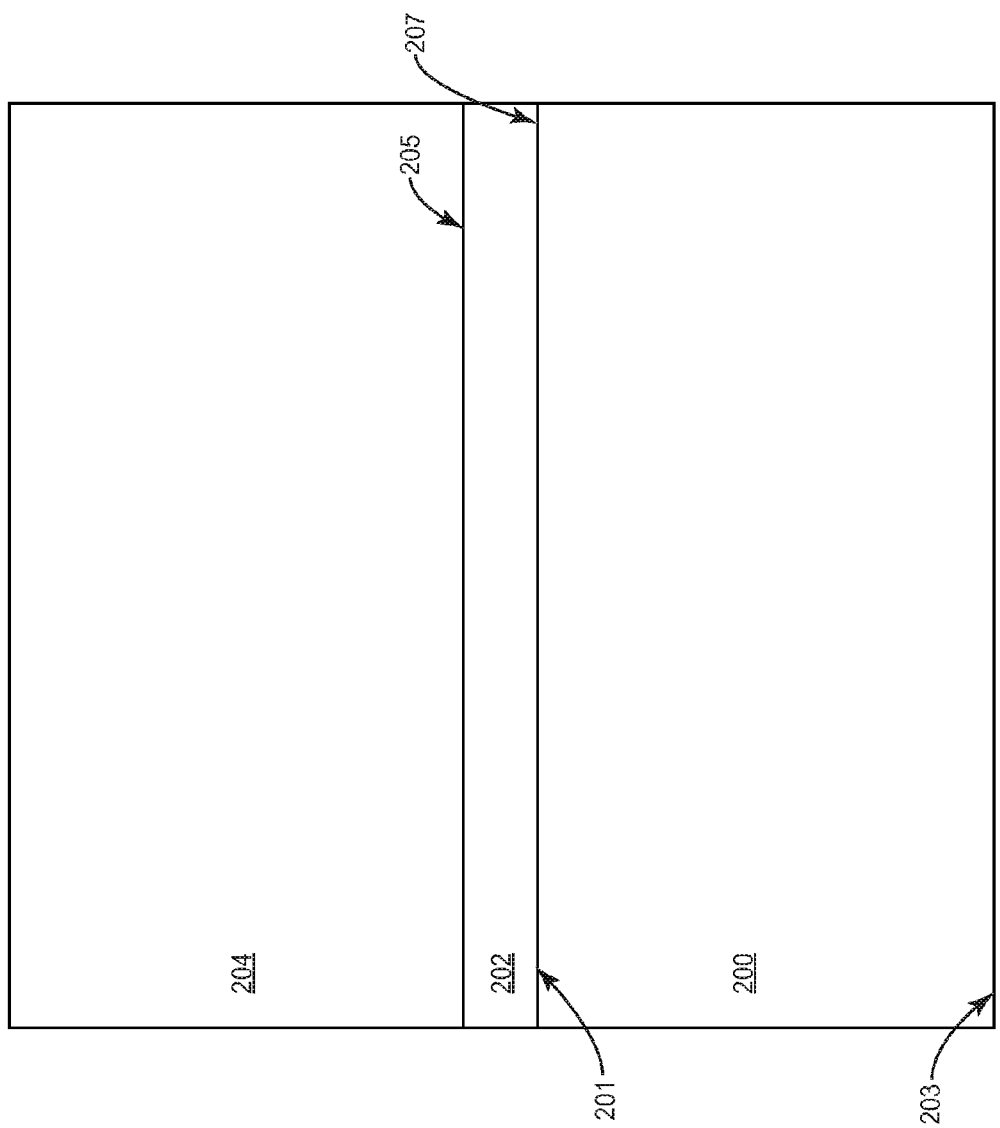

FIG. 9B shows the semiconductor wafer structure after a second (temporary) substrate 204 is bonded to the growth side 205 of the III-N material 202. The temporary substrate 204 is provided for flipping the III-N material 202 so that the original growth side 205 (i.e. the layer with Ga atoms in the case of GaN) is eventually exposed during the second deposition stage. As such, any substrate can be used since the temporary substrate 204 merely provides a mechanical flipping function. For example, a glass wafer or even a Si wafer can be used since the temporary substrate 204 can be reused. The temporary substrate 204 can be something other than a wafer, such as a thick deposition of a stabilization layer on the III-N material 202. If the other (non-growth) side 207 of the III-N material 202 is sufficient for epitaxial deposition (e.g. the layer with N atoms in the case of GaN), then the temporary substrate 204 can be excluded. The temporary substrate 204 can be bonded or deposited on the growth side 205 of the III-N material 202.

Figure 9C:
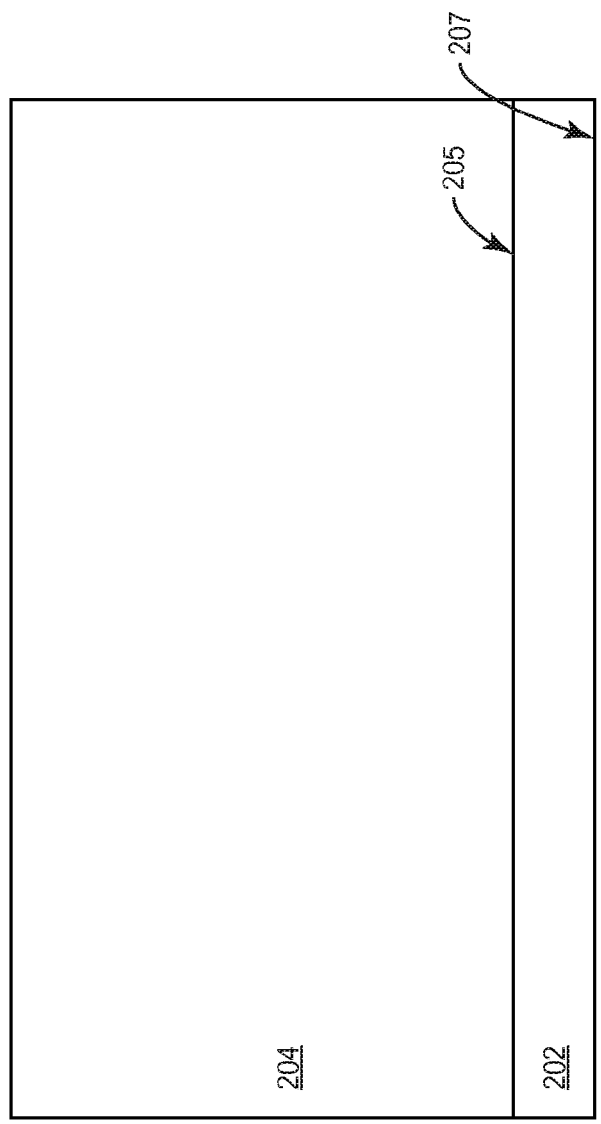

FIG. 9C shows the semiconductor wafer structure after the growth substrate 200 is removed e.g. by wet chemical etching in the case of a Si growth wafer. Other removal processes can be used instead or in addition e.g. such as CMP (chemical mechanical polishing).

Figure 9D:
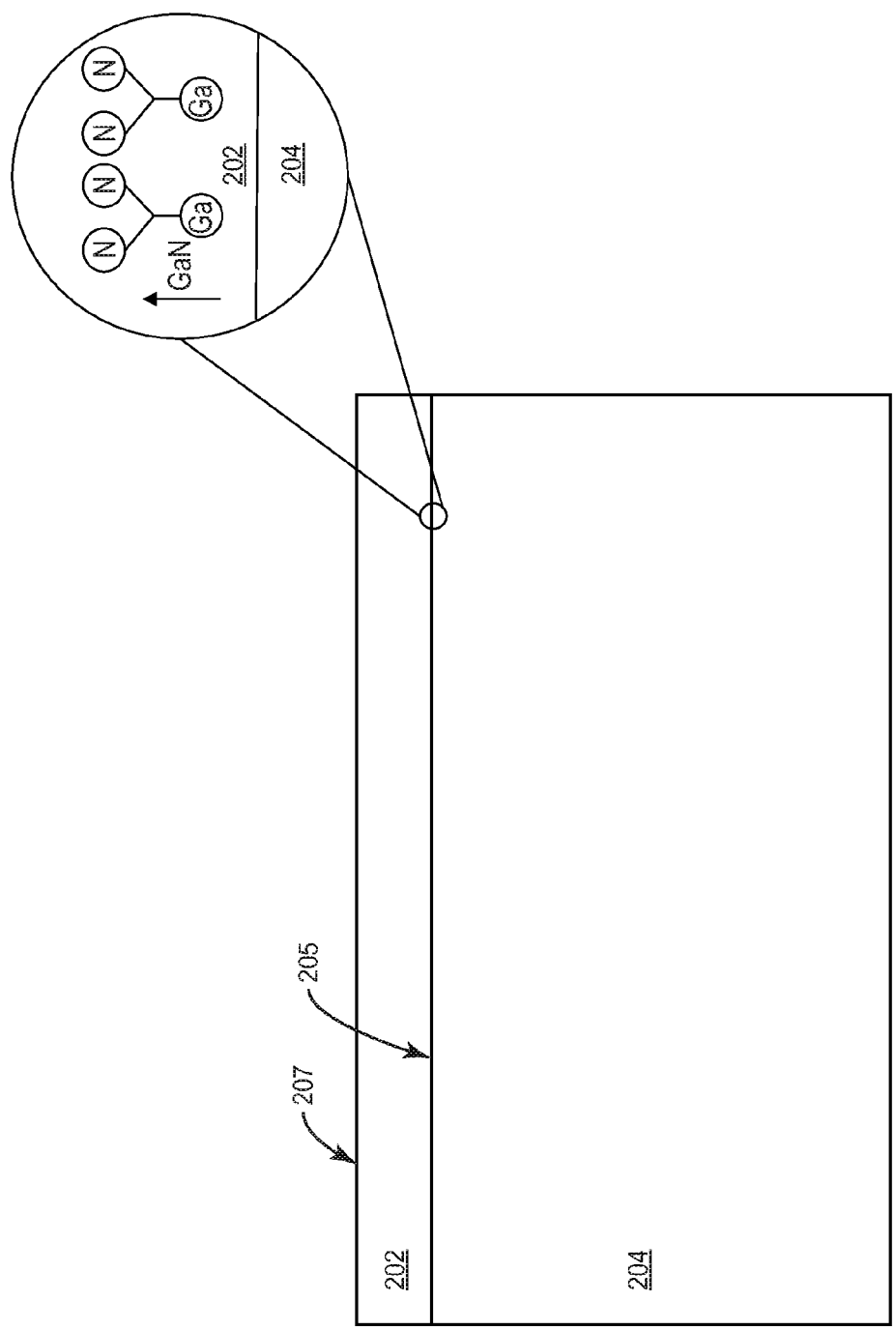

FIG. 9D shows the semiconductor wafer structure after the structure is flipped so that the temporary substrate 204 is below the III-N material 202. The non-growth side 207 of the III-N material 202 (e.g. the layer with N atoms again in the case of GaN) is exposed at the top side of the structure after flipping.

Figure 9E:
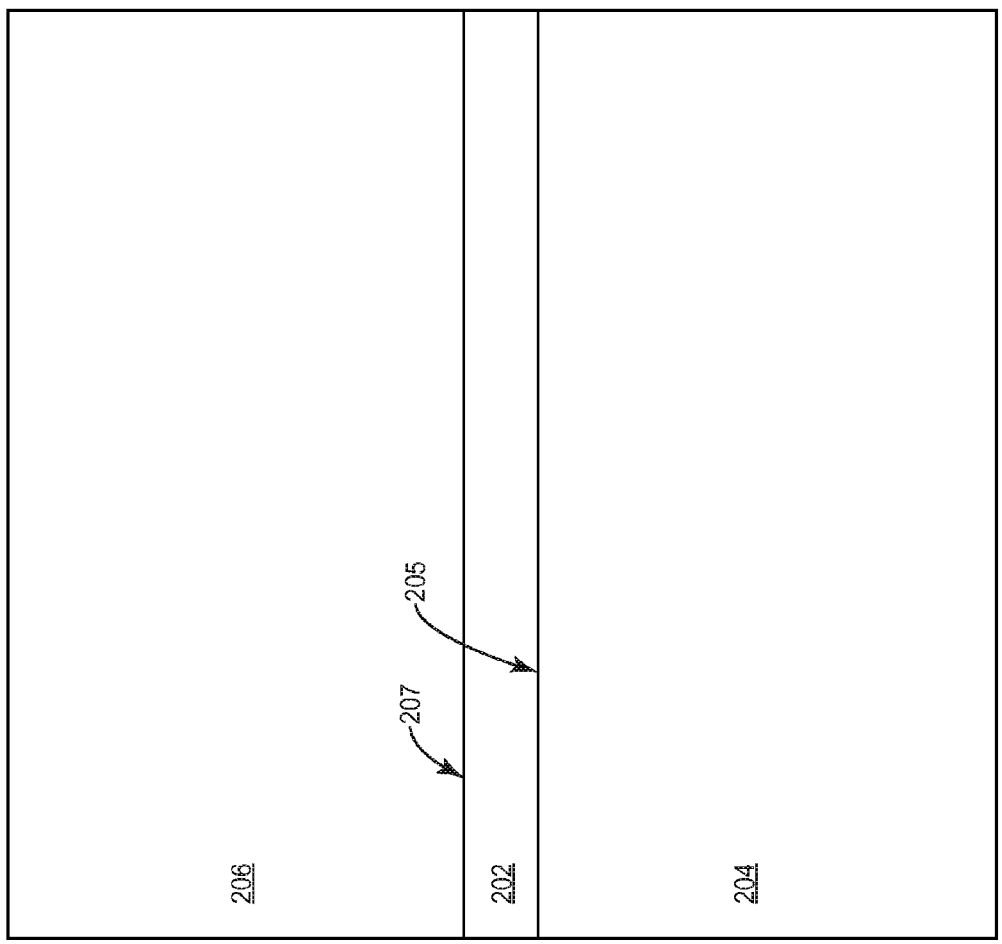

FIG. 9E shows the semiconductor wafer structure after a third (support) substrate 206 is bonded to the III-N material 202 at the non-growth side 207 of the III-N material 202. The support substrate 206 has a CTE more closely matched to that of the III-N material 202 than the original growth substrate 200. The support substrate 206 can be bonded or deposited on the III-N material 202. The support substrate 206 will be under the III-N material 202 during the second deposition stage, is stable enough to withstand the epitaxy process, and has a similar CTE as the III-N material 202. In one embodiment, the support substrate 206 is a germanium (Ge) wafer. Germanium has a CTE of 6.0E-6/K (GaN has a CTE of 5.6E-6/K), and allows much thicker layers than Si substrates (which have a CTE of 2.6E-6/K). A GaAs wafer (GaAs has a CTE of 6.2*10^-6/K) can also be used. Depending on the epitaxy temperature, a Ge or GaAs support wafer 206 can be alloyed with Si to make the wafer 206 more thermally stable even though doing so reduces the overall CTE of the support substrate 206.

For deposition at lower temperatures, pure Ge can be used. The CTE can be even better matched to the III-N material 202 by choosing appropriate alloys. The support substrate 206 can be manipulated e.g. by sealing the support substrate 206 against out-diffusion or doping the support substrate 206 for decreased electrical resistance. Such manipulations can be employed so long as bonding to the III-N material 202 is good enough to withstand the following epitaxy during the second deposition stage. A single crystal wafer need not necessarily be used as the support substrate 206. Still other types of support substrates 206 can be used such as SiGe or BeO, and depends on the type of III-N material 202 being formed. In each case, the lattice structure of the support substrate 206 is not important because the III-N material 202 was made thick enough in the first deposition stage so that the crystal structure of the support substrate 206 does not influence the III-N material 202 during the second deposition stage.

Figure 9F:
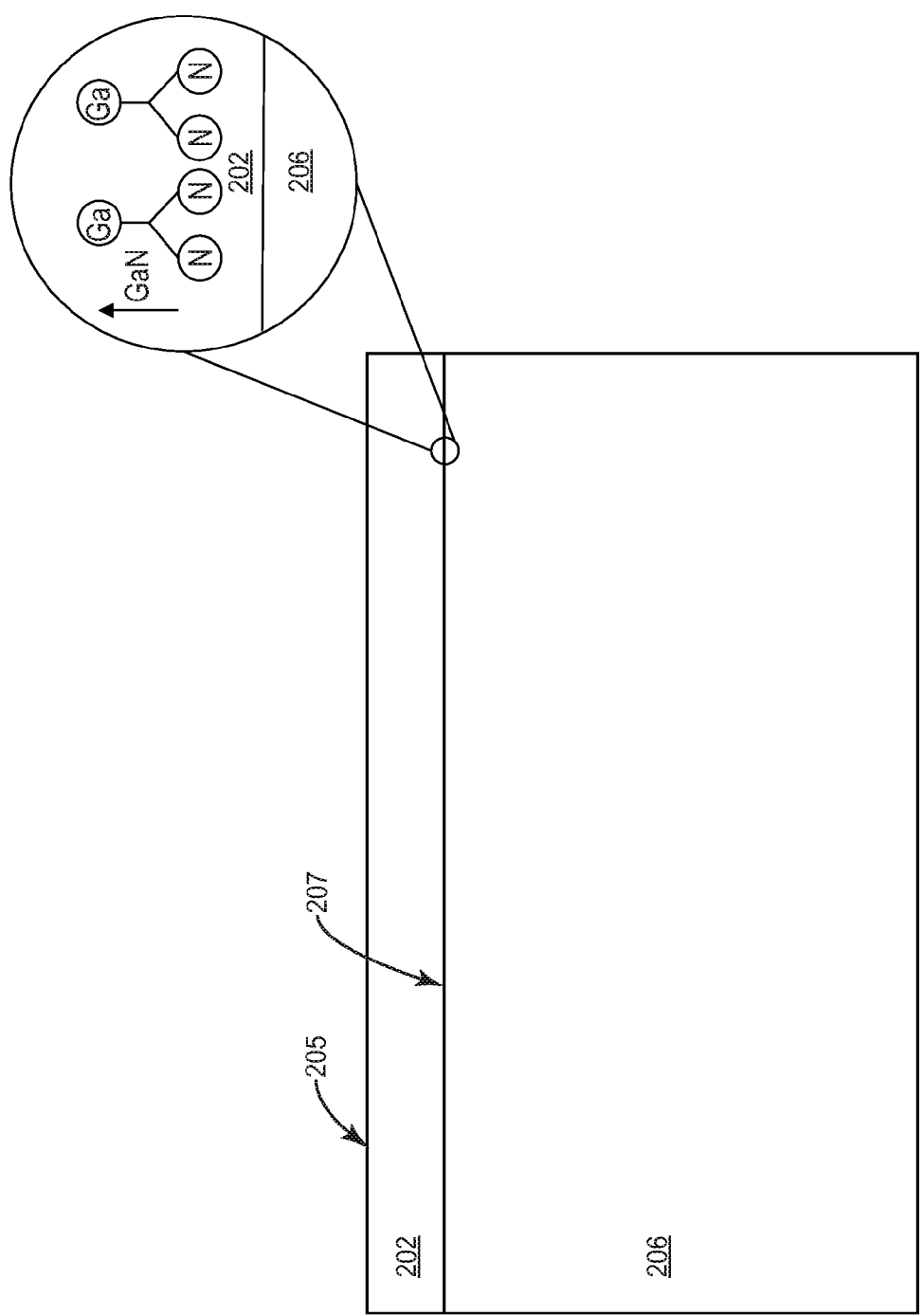

FIG. 9F shows the semiconductor wafer structure after the temporary substrate 204 is removed and the semiconductor wafer structure is flipped so that the support substrate 206 is below the III-N material 202. The original growth side 205 of the III-N material 202 (e.g. the layer with Ga atoms in the case of GaN) is exposed at the top side of the structure after flipping.

Figure 9G:
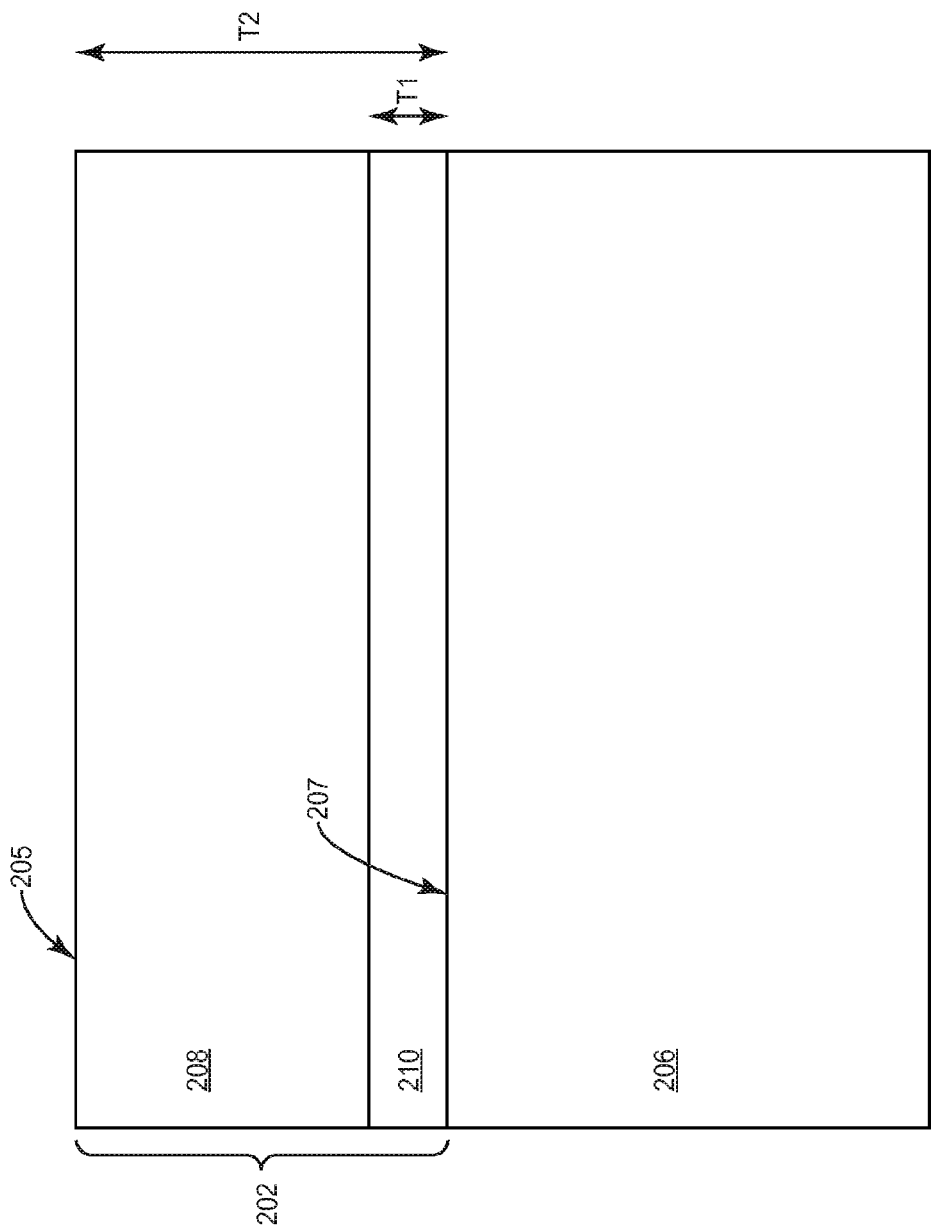

FIG. 9G shows the semiconductor wafer structure after the thickness of the III-N material 202 is increased to a second thickness (T2) greater than the first (initial) thickness (T1) e.g. by MOCVD during the second deposition stage. The first thickness T1 of the III-N material 202 realized during the first deposition step is sufficient to ensure that the support substrate 206 has no influence on the crystal structure of the III-N material 202 as the thickness of the III-N material 202 increases during the second deposition stage. As such, the III-N material 202 can be grown as thick as desired. The III-N material 202 can be made thick enough to have the desired crystal quality, breakdown voltage to the substrate 206 or even to be mechanically stable without the support substrate 206. Further bonding(s) can be used to combine the III-N material 202 with another substrate if needed for the final device e.g. for electrical reasons.

The second deposition can be directly on the III-N material 202, resulting in very good crystal quality. A cleaning/surface preparation step can be performed because of all the bonding. The new layer 208 grows in the same direction as the initial layer 210 formed during the first deposition stage according to this embodiment. This is particularly advantageous for III-N semiconductors.

However, the new layer 208 of the III-N material 202 can grow in the opposite direction by omitting the temporary substrate 204 and eliminating the flipping steps shown in FIGS. 9B through 9D. It may be necessary to still use the original growth side 205 of the III-N material 202 for electrical devices e.g. if a breakdown to the substrate needs to be avoided in a horizontal device. In this case, the second epitaxy begins to grow in a region of worse crystal quality. So roughly the same thickness needs to be grown as during the first epitaxy to reach the same defect density on the surface. Since the second epitaxy does not benefit from the first epitaxy, the first epitaxy can be very short. In each case, the CTE of the support substrate 206 is close enough to that of the III-N material 202 so that little or no cracking occurs in the III-N material 202 during post-deposition cooling. If the deposition of the second layer 210 of the III-N material 202 is thick enough to be mechanically stable, the support substrate 206 can be completely removed by any suitable means such as wet chemical etching, CMP, etc.

FIG. 9H shows the semiconductor wafer structure after the support substrate 206 is removed from the III-N material 202 and after the thickness of the III-N material 202 is increased to the second thickness T2. The III-N material 202 can be grown to any desired thickness according to the embodiments described herein. In one embodiment, the III-N material 202 is GaN and the GaN material 202 has a diameter (D) of at least 200 mm and a thickness (T2) of at least 10 µm. Such a wafer structure can be used e.g. for GaN-on-GaN epitaxy.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing an III-N substrate, the method comprising:
    bonding a Si substrate to a support substrate, the Si substrate having a (111) growth surface facing away from the support substrate;
    thinning the Si substrate at the (111) growth surface to a thickness of 100 µm or less; and
    forming III-N material on the (111) growth surface of the Si substrate after the Si substrate is thinned,
    wherein the support substrate has a coefficient of thermal expansion more closely matched to that of the III-N material than the Si substrate.

2. The method according to claim 1, further comprising forming a plurality of trenches in the Si substrate at a bonding surface of the substrate facing away from the (111) growth surface, wherein the Si substrate is bonded to the support substrate at the bonding surface after the trenches are formed.

3. The method according to claim 2, further comprising at least partly filling the trenches with a material before the Si substrate is bonded to the support substrate at the bonding surface.

4. The method according to claim 3, wherein the material at least partly filling the trenches is a dielectric material that also covers the bonding surface of the Si substrate, and wherein the support substrate is bonded to the dielectric material covering the bonding surface of the Si substrate.

5. The method according to claim 3, wherein the thinning of the Si substrate exposes the trenches at the (111) growth surface so that the Si substrate is separated into islands of Si material.

6. The method according to claim 3, further comprising removing the material from the bonding surface of the Si substrate, wherein the support substrate is bonded to the bonding surface of the Si substrate after the material is removed from the bonding surface.

7. The method according to claim 6, further comprising forming additional Si on the bonding surface of the Si substrate after the material is removed from the bonding surface so that the material in the trenches is surrounded on all sides by Si, wherein the support substrate is bonded to the Si substrate after the additional Si is deposited on the bonding surface of the Si substrate so that the support substrate is separated from the material in the trenches by the additional Si.

8. The method according to claim 7, wherein the thinning of the Si substrate exposes the trenches at the (111) growth surface.

9. The method according to claim 2, wherein the trenches are wider than the Si material between the trenches.

10. The method according to claim 9, further comprising filing the trenches with a dielectric material, wherein the III-N material is formed by an epitaxial lateral overgrowth process and a majority of slip-lines in the III-N material resulting from the epitaxial lateral overgrowth process are disposed over Si and not the trenches.

11. The method according to claim 3, wherein the trenches are filled with at least two different materials.

12. The method according to claim 11, wherein an inner part of the trenches is filled with an electrically conductive material and an outer part of the trenches surrounding the inner part is filled with an electrically insulating material.

13. The method according to claim 3, wherein the material partly fills the trenches by lining sidewalls and tops of the trenches so that the trenches are enclosed and an inner part of the trenches is filled with a gas.

14. The method according to claim 2, wherein the trenches are open at the (111) growth surface of the Si substrate when the III-N material begins forming on the (111) growth surface.

15. The method according to claim 1, wherein the III-N material is at least 10 μm thick.

* * * * *

UNITED STATES PATENT AND TRADEMARK OFFICE
CERTIFICATE OF CORRECTION

PATENT NO. : 9,048,091 B2  
APPLICATION NO. : 13/849864  
DATED : June 2, 2015  
INVENTOR(S) : M. Vielemeyer Page 1 of 1

It is certified that error appears in the above-identified patent and that said Letters Patent is hereby corrected as shown below:

In the Claims
Column 11, line 12 (claim 10, line 2) please change "filing the" to -- filling the --

Signed and Sealed this
Second Day of February, 2016

Michelle K. Lee
*Director of the United States Patent and Trademark Office*